United States Patent
Li et al.

(10) Patent No.: US 12,190,821 B2
(45) Date of Patent: Jan. 7, 2025

(54) DISPLAY SUBSTRATE AND DISPLAY APPARATUS EACH HAVING SUB-PIXELS APPLIED WITH DIFFERENT OPERATING VOLTAGES

(71) Applicants: Beijing BOE Technology Development Co., Ltd., Beijing (CN); BOE TECHNOLOGY GROUP CO., LTD., Beijing (CN)

(72) Inventors: Pan Li, Beijing (CN); Yichi Zhang, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/793,376

(22) PCT Filed: Jun. 24, 2021

(86) PCT No.: PCT/CN2021/102083
§ 371 (c)(1),
(2) Date: Jul. 15, 2022

(87) PCT Pub. No.: WO2022/266932
PCT Pub. Date: Dec. 29, 2022

(65) Prior Publication Data
US 2024/0177675 A1    May 30, 2024

(51) Int. Cl.
*G09G 3/3258*        (2016.01)
*G09G 3/3275*        (2016.01)

(52) U.S. Cl.
CPC ......... *G09G 3/3258* (2013.01); *G09G 3/3275* (2013.01); *G09G 2300/0426* (2013.01);
(Continued)

(58) Field of Classification Search
CPC .................................................. G09G 3/3258
(Continued)

(56) References Cited

U.S. PATENT DOCUMENTS 10,103,213 B2  10/2018  Oh et al.
10,971,556 B1*  4/2021  Fang .................... H10K 59/131
(Continued)

FOREIGN PATENT DOCUMENTS

| CN | 101026184 A | 8/2007 |
|---|---|---|
| CN | 102354479 A | 2/2012 |

(Continued)

OTHER PUBLICATIONS

European Patent Office, EESR dated Feb. 13, 2024, for corresponding EP application 21946428.6.

*Primary Examiner* — Long D Pham
(74) *Attorney, Agent, or Firm* — HOUTTEMAN LAW LLC

(57) ABSTRACT

A display substrate includes: a base, and pixel units arranged in an array, each pixel unit including at least two sub-pixels each including: a pixel driving circuit, and a light-emitting element. The light-emitting element includes: a first electrode, a light-emitting layer, and a second electrode arranged on the base sequentially. Each sub-pixel is configured with a corresponding operating voltage transmission line. The pixel driving circuit includes: a driving transistor with a first pole electrically connected to the operating voltage transmission line. The operating voltage transmission line is located between a layer structure where a control pole of the driving transistor is located and a layer structure where the first electrode is located. The at least two sub-pixels include: at least one first sub-pixel and at least one second sub-pixel.

(Continued)

The first and second sub-pixels are configured with first and second operating voltage transmission lines insulated from each other, respectively.

18 Claims, 19 Drawing Sheets

(52) U.S. Cl.
CPC ............... *G09G 2300/0842* (2013.01); *G09G 2310/061* (2013.01); *G09G 2310/08* (2013.01)

(58) Field of Classification Search
USPC ......................................................... 345/204
See application file for complete search history.

(56) References Cited

U.S. PATENT DOCUMENTS

| | | | |
|---|---|---|---|
| 11,238,767 | B2 | 2/2022 | Yuan et al. |
| 2007/0195043 | A1 | 8/2007 | Furuie et al. |
| 2011/0291115 | A1 | 12/2011 | Kim et al. |
| 2012/0249602 | A1 | 10/2012 | Liu et al. |
| 2014/0239823 | A1 | 8/2014 | Ahn |
| 2015/0015467 | A1 | 1/2015 | Kaplan et al. |
| 2015/0015590 | A1* | 1/2015 | Jeong .................... G09G 3/2003 345/502 |
| 2015/0187859 | A1* | 7/2015 | Choi .................... G09G 3/3225 257/72 |
| 2015/0255017 | A1 | 9/2015 | Kim |
| 2020/0394968 | A1* | 12/2020 | Kwon .................. G09G 3/3266 |
| 2021/0233477 | A1 | 7/2021 | Li et al. |
| 2022/0327987 | A1 | 10/2022 | Sun et al. |

FOREIGN PATENT DOCUMENTS

| | | |
|---|---|---|
| CN | 105762172 A | 7/2016 |
| CN | 106486522 A | 3/2017 |
| CN | 107331338 A | 11/2017 |
| CN | 107871772 A | 4/2018 |
| CN | 109859692 A | 6/2019 |
| CN | 111477159 A | 7/2020 |
| CN | 111613180 A | 9/2020 |
| CN | 112435622 A | 3/2021 |
| JP | 2006073520 A | 3/2006 |
| KR | 20190063233 A | 6/2019 |

* cited by examiner

DISPLAY SUBSTRATE AND DISPLAY APPARATUS EACH HAVING SUB-PIXELS APPLIED WITH DIFFERENT OPERATING VOLTAGES

CROSS REFERENCE TO RELATED APPLICATIONS

This is a National Phase Application filed under 35 U.S.C. 371 as a national stage of PCT/CN2021/102083 filed on Jun. 24, 2021, the content of which is incorporated herein by reference in its entirety.

TECHNICAL FIELD

The present disclosure relates to the field of display technology, and in particular relates to a display substrate and a display apparatus.

BACKGROUND

Display apparatuses using electroluminescent display elements, such as organic light-emitting diodes (OLEDs) and quantum dot light-emitting diodes (QLEDs), have become popular choices in flat panel displays.

A display apparatus includes a plurality of pixel units each including a plurality of sub-pixels, and each sub-pixel includes a pixel driving circuit and a light-emitting element (such as an OLED or a QLED), where the pixel driving circuit is configured to drive the light-emitting element to emit light. To implement color display, different light-emitting elements in a same pixel unit may be configured to emit light of different colors. For example, the plurality of light-emitting elements in the same pixel unit may include a red light-emitting element, a green light-emitting element, and a blue light-emitting element. Different types of light-emitting elements may correspond to different driving voltages. For example, the blue light-emitting element typically requires a driving voltage greater than a driving voltage for each of the red light-emitting element and the green light-emitting element. In general, to realize driving of all light-emitting elements, an operating voltage in the display apparatus is typically set according to the light-emitting element that requires the highest driving voltage. When the pixel driving circuit drives a corresponding light-emitting element to emit light, the operating voltage will be written into the corresponding light-emitting element by the pixel driving circuit (considering a voltage drop generated by a transistor in the pixel driving circuit, the actual driving voltage written into the light-emitting element will be lower than the operating voltage).

However, when different types of light-emitting elements are provided with a same driving voltage, heat generation and power consumption will increase for a light-emitting element that requires a driving voltage lower than the actual driving voltage.

SUMMARY

Some embodiments of the present disclosure provide a display substrate and a display apparatus.

In a first aspect, an embodiment of the present disclosure provides a display substrate, including:
   a base, including: a display region, and a peripheral region surrounding the display region;
   a plurality of pixel units located in the display region and arranged in an array, each pixel unit includes at least two sub-pixels each including: a pixel driving circuit, and a light-emitting element, wherein the light-emitting element includes: a first electrode, a light-emitting layer, and a second electrode arranged in sequence along a direction away from the base, wherein each sub-pixel is configured with a corresponding operating voltage transmission line, and the pixel driving circuit includes: a driving transistor with a first pole electrically connected to the corresponding operating voltage transmission line, and a second pole electrically connected to the first electrode, the first electrode is located on a side of the driving transistor distal to the base, and the operating voltage transmission line is located between a layer structure where a control pole of the driving transistor is located and a layer structure where the first electrode is located and
   the at least two sub-pixels include: at least one first sub-pixel and at least one second sub-pixel, wherein the first sub-pixel is configured with a first operating voltage transmission line, and the second sub-pixel is configured with a second operating voltage transmission line, and the first operating voltage transmission line is insulated from the second operating voltage transmission line.

In some embodiments, each sub-pixel is configured with a corresponding data line electrically connected to the pixel driving circuit, and a layer structure where the data line is located is between the layer structure where the control pole of the driving transistor is located and the layer structure where the first electrode is located;
   the first operating voltage transmission line is disposed in the same layer as the data line and
   the second operating voltage transmission line is disposed in the same layer as the data line, or located between the layer structure where the data line is located and the layer structure where the first electrode is located.

In some embodiments, the at least two sub-pixels further include: at least one third sub-pixel and
   in a same pixel unit, the first sub-pixel and the third sub-pixel are configured with a same first operating voltage transmission line.

In some embodiments, the at least two sub-pixels further include: at least one third sub-pixel;
   the third sub-pixel is configured with a third operating voltage transmission line that is insulated from the first operating voltage transmission line and the second operating voltage transmission line.

In some embodiments, each sub-pixel is configured with a corresponding data line electrically connected to the pixel driving circuit, and a layer structure where the data line is located is between the layer structure where the control pole of the driving transistor is located and the layer structure where the first electrode is located;
   the third operating voltage transmission line is disposed in the same layer as the data line, or located between the layer structure where the data line is located and the layer structure where the first electrode is located.

In some embodiments, the plurality of pixel units are arranged in an array taking a first direction as a row direction and a second direction as a column direction;
   each pixel unit includes four sub-pixels, including two first sub-pixels, one second sub-pixel, and one third sub-pixel, and pixel driving circuits of the four sub-pixels in the pixel unit are arranged in a 2×2 matrix taking the first direction as a row direction and the second direction as a column direction;

among the four pixel driving circuits arranged in the 2×2 matrix in a same pixel unit, the pixel driving circuits of the two first sub-pixels are arranged in one column, while the pixel driving circuit of the one second sub-pixel and the pixel driving circuit of the one third sub-pixel are arranged in the other column; and in the array formed by the plurality of pixel units, any two adjacent pixel units in the row direction form a repeated unit in which two second sub-pixels are located in different rows, and two third sub-pixels are located in different rows, respectively.

In some embodiments, each pixel driving circuit further includes: a storage capacitor; and the storage capacitor has a first end plate electrically connected to a corresponding operating voltage transmission line, and a second end plate electrically connected to the control pole of the driving transistor.

In some embodiments, the pixel driving circuit further includes: a data write transistor, a threshold compensation transistor, a first reset transistor, a second reset transistor, a first light-emitting control transistor, and a second light-emitting control transistor, wherein the first pole of the driving transistor is electrically connected to the corresponding operating voltage transmission line through the first light-emitting control transistor, and the second pole of the driving transistor is electrically connected to the first electrode through the second light-emitting control transistor;

the data write transistor has a control pole electrically connected to a gate line in a corresponding row, a first pole electrically connected to a data line in a corresponding column, and a second pole electrically connected to the first pole of the driving transistor;

the threshold compensation transistor has a control pole electrically connected to the gate line in the corresponding row, a first pole electrically connected to the second pole of the driving transistor and a second pole electrically connected to the control pole of the driving transistor;

the first reset transistor has a control pole electrically connected to a reset control signal line in the corresponding row, a first pole electrically connected to a reset voltage transmission line, and a second pole electrically connected to the control pole of the driving transistor;

the second reset transistor has a control pole electrically connected to the reset control signal line in the corresponding row, a first pole electrically connected to the reset voltage transmission line, and a second pole electrically connected to the first electrode;

the first light-emitting control transistor has a control pole electrically connected to a light-emitting control signal line, a first pole electrically connected to the operating voltage transmission line, and a second pole electrically connected to the first pole of the driving transistor and the second light-emitting control transistor has a control pole electrically connected to the light-emitting control signal line, a first pole connected to the second pole of the driving transistor and a second pole electrically connected to the first electrode.

In some embodiments, the display substrate includes: an active semiconductor layer, a gate insulation layer structure, a first conductive layer structure, a first insulation layer structure, a second conductive layer structure, a second insulation layer structure, and a third conductive layer structure sequentially arranged along the direction away from the base; wherein the active semiconductor layer includes: an active layer pattern and a source-drain doped region pattern of each transistor in the pixel driving circuit;

the first conductive layer structure includes: the control pole of each transistor, the reset control signal line, the gate line, the second end plate of the storage capacitor, and the light-emitting control signal line in the pixel driving circuit;

the second conductive layer structure includes: the reset voltage transmission line and the first end plate of the storage capacitor and the third conductive layer structure includes: the data line and the first operating voltage transmission line.

In some embodiments, the control pole of the data write transistor, the control pole of the threshold compensation transistor, the control pole of the first reset transistor, and the control pole of the second reset transistor are each located on a first side of the control pole of the driving transistor, the control pole of the first light-emitting control transistor and the control pole of the second light-emitting control transistor are each located on a second side of the control pole of the driving transistor, and the first side and the second side are opposite sides in the second direction;

the control pole of the data write transistor and the control pole of the first light-emitting control transistor are each located on a third side of the control pole of the driving transistor, a first control pole of the threshold compensation transistor, the control pole of the second light-emitting control transistor, and the control pole of the second reset transistor are each located on a fourth side of the control pole of the driving transistor, and the third side and the fourth side are opposite sides in the first direction;

the data line and the first operating voltage transmission line both extend in the second direction; and for any one of the first sub-pixels, the data line configured for the first sub-pixel is located on a third side of the first operating voltage transmission line configured for the first sub-pixel.

In some embodiments, the second operating voltage transmission line extends in the second direction; and for any one of the second sub-pixels, an orthogonal projection of the data line configured for the second sub-pixel on the base is located on a third side of the second operating voltage transmission line configured for the second sub-pixel.

In some embodiments, in a same pixel unit, the first sub-pixel and the third sub-pixel are configured with a same first operating voltage transmission line;

the first operating voltage transmission line has an orthogonal projection on the base overlapped with an orthogonal projection on the base of the source-drain doped region pattern corresponding to the first pole of the first light-emitting control transistor in the pixel driving circuit of a corresponding first sub-pixel, and is connected to the source-drain doped region pattern corresponding to the first pole of the first light-emitting control transistor in the pixel driving circuit of the corresponding first sub-pixel through a via;

the first end plate of the storage capacitor in the pixel driving circuit of the third sub-pixel includes a first extension part and a second extension part;

the first extension part is directly connected to the first end plate of the storage capacitor in the pixel driving circuit of an adjacent first sub-pixel in the first direction and located in the same pixel unit and the second extension part has an orthogonal projection on the base overlapped with an orthogonal projection on the base of the source-drain doped region pattern corresponding to the first pole of the first light-emitting control transistor in the same pixel driving circuit, and is connected to the source-drain doped region pattern corresponding to the first pole of the first light-emitting control transistor in the same pixel driving circuit through a via.

In some embodiments, in a same pixel unit, the first sub-pixel and the third sub-pixel are configured with a same first operating voltage transmission line;

the first operating voltage transmission line has an orthogonal projection on the base overlapped with an orthogonal projection on the base of the source-drain doped region pattern corresponding to the first pole of the first light-emitting control transistor in the pixel driving circuit of a corresponding first sub-pixel, and is connected to the source-drain doped region pattern corresponding to the first pole of the first light-emitting control transistor in the pixel driving circuit of the corresponding first sub-pixel through a via;

the first end plate of the storage capacitor in the pixel driving circuit of the third sub-pixel includes a first extension part which is directly connected to the first end plate of the storage capacitor in the pixel driving circuit of an adjacent first sub-pixel in the first direction and located in the same pixel unit and the second operating voltage transmission line has an orthogonal projection on the base overlapped with an orthogonal projection on the base of the source-drain doped region pattern corresponding to the first pole of the first light-emitting control transistor in the pixel driving circuit of a corresponding second sub-pixel, and is connected to the source-drain doped region pattern corresponding to the first pole of the first light-emitting control transistor in the pixel driving circuit of the corresponding second sub-pixel through a via; and the source-drain doped region pattern corresponding to the first pole of the first light-emitting control transistor in the pixel driving circuit of the third sub-pixel is electrically connected to the first operating voltage transmission line configured for the first sub-pixel in the same pixel unit through a conductive bridge line, and the conductive bridge line is connected to the source-drain doped region pattern corresponding to the first pole of the first light-emitting control transistor in the pixel driving circuit of the third sub-pixel through a via.

In some embodiments, the second operating voltage transmission line is bent around the via through which the conductive bridge line is connected to the source-drain doped region pattern corresponding to the first pole of the corresponding first light-emitting control transistor, and towards a side distal to the conductive bridge line to form a protruding bypass structure.

In some embodiments, in a same pixel driving circuit, the source-drain doped region pattern corresponding to the first pole of the first light-emitting control transistor is disposed opposite to the source-drain doped region pattern corresponding to the second pole of the second light-emitting control transistor in the first direction;

in the pixel driving circuit of the third sub-pixel, the source-drain doped region pattern corresponding to the first pole of the first light-emitting control transistor has a first length in the first direction;

in the pixel driving circuit of the first sub-pixel or the second sub-pixel, the source-drain doped region pattern corresponding to the first pole of the first light-emitting control transistor has a second length in the first direction, and the second length is smaller than the first length;

in the pixel driving circuit of the third sub-pixel, the source-drain doped region pattern corresponding to the first pole of the first light-emitting control transistor is spaced apart from the source-drain doped region pattern corresponding to the second pole of the second light-emitting control transistor by a first interval in the first direction; and in the pixel driving circuit of the second sub-pixel, the source-drain doped region pattern corresponding to the first pole of the first light-emitting control transistor is spaced apart from the source-drain doped region pattern corresponding to the second pole of the second light-emitting control transistor by a second interval in the first direction, and the first interval is smaller than the second interval.

In some embodiments, a third insulation layer structure, a fourth conductive layer structure, and a fourth insulation layer structure are sequentially arranged between the third conductive layer structure and the layer structure where the first electrode is located in the direction away from the base;

the third conductive layer structure includes a third connection part, the fourth conductive layer structure includes a fourth connection part, and the second pole of the second light-emitting control transistor is electrically connected to the first electrode through the third connection part and the fourth connection part sequentially; and the fourth conductive layer structure includes the conductive bridge line.

In some embodiments, the third sub-pixel is configured with a third operating voltage transmission line that is insulated from the first operating voltage transmission line and the second operating voltage transmission line;

the first operating voltage transmission line has an orthogonal projection on the base overlapped with an orthogonal projection on the base of the source-drain doped region pattern corresponding to the first pole of the first light-emitting control transistor in the pixel driving circuit of a corresponding first sub-pixel, and is connected to the source-drain doped region pattern corresponding to the first pole of the first light-emitting control transistor in the pixel driving circuit of the corresponding first sub-pixel through a via;

the second operating voltage transmission line has an orthogonal projection on the base overlapped with an orthogonal projection on the base of the source-drain doped region pattern corresponding to the first pole of the first light-emitting control transistor in the pixel driving circuit of a corresponding second sub-pixel, and is connected to the source-drain doped region pattern corresponding to the first pole of the first light-emitting control transistor in the pixel driving circuit of the corresponding second sub-pixel through a via;

the third operating voltage transmission line has an orthogonal projection on the base overlapped with an orthogonal projection on the base of the source-drain doped region pattern corresponding to the first pole of the first light-emitting control transistor in the pixel driving circuit of a corresponding third sub-pixel, and is connected to the source-drain doped region pattern corresponding to the first pole of the first light-emitting control transistor in the pixel driving circuit of the corresponding third sub-pixel through a via;

the third operating voltage transmission line extends in the second direction; and in a same pixel unit, the third sub-pixel and the second sub-pixel are configured with a same data line which has on the base an orthogonal projection located on a third side of the orthogonal projection of the third operating voltage transmission line configured for the third sub-pixel on the base, and the orthogonal projection of the third operating voltage transmission line configured for the third sub-pixel on the base is located on a third side of the orthogonal projection of the second operating voltage transmission line configured for the second sub-pixel on the base.

In some embodiments, the display substrate further includes: a plurality of first operating voltage connection lines extending in a direction crossed with an extending direction of the first operating voltage transmission line, and each first operating voltage connection line is electrically connected to at least two first operating voltage transmission lines; and each first operating voltage connection line is disposed in the same layer as the first end plate of the storage capacitor.

In some embodiments, the display substrate further includes: a plurality of second operating voltage connection lines extending in a direction crossed with an extending direction of the second operating voltage transmission line, and each second operating voltage connection line is electrically connected to at least two second operating voltage transmission lines and each second operating voltage connection line is disposed in the same layer as the first end plate of the storage capacitor, or disposed in the same layer as the first electrode, or located between the layer structure where the first end plate of the storage capacitor is located and the layer structure where the first electrode is located.

In some embodiments, the pixel driving circuit further includes: a first reset transistor and/or a second reset transistor;

the first reset transistor has a control pole electrically connected to a reset control signal line in a corresponding row, a first pole electrically connected to a reset voltage transmission line, and a second pole electrically connected to the control pole of the driving transistor;

the second reset transistor has a control pole electrically connected to the reset control signal line in the corresponding row, a first pole electrically connected to the reset voltage transmission line, and a second pole electrically connected to the first electrode;

the reset control signal line is disposed in the same layer as the second end plate of the storage capacitor and extends in the first direction, the reset voltage transmission line is disposed in the same layer as the first end plate of the storage capacitor and extends in the first direction, an orthogonal projection of the reset control signal line on the base is not overlapped with an orthogonal projection of the reset voltage transmission line on the base; and the second operating voltage transmission line is located between the layer structure where the first end plate of the storage capacitor is located and the layer structure where the first electrode is located, and extends in the first direction and the second operating voltage transmission line has on the base an orthogonal projection located in a coverage region of an orthogonal projection of the reset voltage transmission line on the base, or the second operating voltage transmission line has on the base an orthogonal projection located in a coverage region of an orthogonal projection of the reset control signal line on the base.

In some embodiments, the third sub-pixel is configured with a third operating voltage transmission line;

the display substrate further includes: a plurality of third operating voltage connection lines extending in a direction crossed with an extending direction of the third operating voltage transmission line, and each third operating voltage connection line is electrically connected to at least two third operating voltage transmission lines and each third operating voltage connection line is disposed in the same layer as the first end plate of the storage capacitor, or disposed in the same layer as the first electrode, or located between the layer structure where the first end plate of the storage capacitor is located and the layer structure where the first electrode is located.

In some embodiments, in a same pixel unit, the first sub-pixel and the third sub-pixel are configured with a same first operating voltage transmission line;

the display substrate further includes: a plurality of first operating voltage connection lines and a plurality of second operating voltage connection lines;

the plurality of first operating voltage connection lines and the plurality of second operating voltage connection lines both extend in the first direction, the first operating voltage transmission line and the second operating voltage transmission line both extend in the second direction, each first operating voltage connection line is electrically connected to at least two first operating voltage transmission lines, each second operating voltage connection line is electrically connected to at least two second operating voltage transmission lines; and each first operating voltage connection line and each second operating voltage connection line are disposed in the same layer as the first end plate of the storage capacitor.

In some embodiments, in any row of the sub-pixels, first end plates of two storage capacitors in any two adjacent second sub-pixels are connected together through one of the second operating voltage connection lines, and first end plates of three storage capacitors in two first sub-pixels and one third sub-pixel between two adjacent second sub-pixels are connected together through one of the first operating voltage connection lines.

In some embodiments, the third sub-pixel is configured with a third operating voltage transmission line;

the display substrate further includes: a plurality of first operating voltage connection lines, a plurality of second operating voltage connection lines, and a plurality of third operating voltage connection lines;

the plurality of first operating voltage connection lines, the plurality of second operating voltage connection lines and the plurality of third operating voltage connection lines all extend in the first direction, the first operating voltage transmission line, the second operating voltage transmission line and the third operating voltage transmission line each extend in the second direction, each first operating voltage connection line is electrically connected to at least two first operating voltage transmission lines, each second operating voltage connection line is electrically connected to at least two second operating voltage transmission lines, and each third operating voltage connection line is electrically connected to at least two third operating voltage transmission lines; and each first operating voltage connection line, each second operating voltage connection line and each third operating voltage connection line are disposed in the same layer as the first end plate of the storage capacitor.

In some embodiments, in any row of the sub-pixels, first end plates of two storage capacitors in any two adjacent second sub-pixels are connected together through one of the second operating voltage connection lines, first end plates of two storage capacitors in any two adjacent third sub-pixels are connected together through one of the third operating voltage connection lines, first end plates of two storage capacitors in two first sub-pixels between two adjacent second sub-pixels are connected together through one of the first operating voltage connection lines, and the second operating voltage connection lines and the third operating voltage connection lines are located on opposite sides of the first operating voltage connection lines; or in any row of the sub-pixels, first end plates of two storage capacitors in any two adjacent second sub-pixels are connected together through one of the second operating voltage connection lines, first end plates of two storage capacitors in any two adjacent third sub-pixels are connected together through one of the third operating voltage connection lines, first end plates of two storage capacitors in two first sub-pixels between two adjacent third sub-pixels are connected together through one of the first operating voltage connection lines, and the second operating voltage connection line and the third operating voltage connection line are located on opposite sides of the first operating voltage connection line.

In some embodiments, the first sub-pixel includes a green light-emitting element, the second sub-pixel includes a blue light-emitting element, and the third sub-pixel includes a red light-emitting element.

In some embodiments, the display substrate further includes: a first operating voltage peripheral lead and a second operating voltage peripheral lead both in the peripheral region; wherein the first operating voltage transmission line extends into the peripheral region and is electrically connected to the first operating voltage peripheral lead, and the second operating voltage transmission line extends into the peripheral region and is electrically connected to the second operating voltage peripheral lead.

In some embodiments, a material of the light-emitting layer includes a quantum dot material.

In a second aspect, an embodiment of the present disclosure further provides a display apparatus, including: the display substrate as provided in the first aspect.

DETAIL DESCRIPTION OF EMBODIMENTS

Figure 1A:
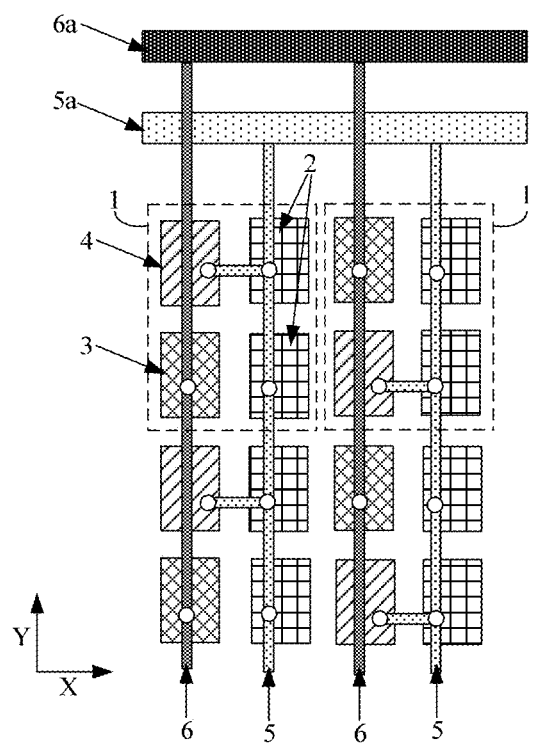
FIG. 1A is a schematic top view of a display substrate according to an embodiment of the present disclosure.

To make the objects, technical solutions and advantages of the present disclosure clearer, the technical solutions in the embodiments of the present disclosure will now be described clearly and completely with reference to the accompanying drawings of the embodiments of the present disclosure. Obviously, the described embodiments are only a part, not all, of embodiments of the present disclosure. Further, the embodiments of the present disclosure and features therein may be combined with each other in any manner as long as they are not contradictory. Based on the described embodiments of the present disclosure, other embodiments obtained by those ordinary skilled in the art without any creative labor all fall within the protection scope of the present disclosure.

Unless otherwise defined, technical or scientific terms used in the present disclosure are intended to have general meanings as understood by those of ordinary skill in the art. The words "first", "second" and similar terms used in the present disclosure do not denote any order, quantity, or importance, but are used merely for distinguishing different components from each other. The word "comprising", "including", or the like means that the element or item preceding the word contains elements or items that appear after the word or equivalents thereof, but does not exclude other elements or items. The term "connected", "coupled" or the like is not restricted to physical or mechanical connections, but may include electrical connections, whether direct or indirect connections.

It should be noted that the transistors used in the embodiments of the present disclosure may be thin film transistors, field effect transistors, or other devices with the same or similar characteristics, and since the source electrode and the drain electrode of each transistor adopted are symmetrical, there is no difference between the source electrode and the drain electrode of the transistor. In an embodiment of the present disclosure, to distinguish the source electrode and the drain electrode of a transistor, one of the source electrode and the drain electrode is referred to as a first pole (or a first electrode, and the term of "pole" is used here to be distinguished from an electrode of a light-emitting element), and the other is referred to as a second pole and the gate electrode of a transistor is called a control pole. In addition, transistors may be divided into N-type transistors and P-type transistors according to the characteristics of the transistors. When a P-type transistor is adopted, the first pole refers to the drain electrode of the P-type transistor, the second pole refers to the source electrode of the P-type transistor, and the case of an N-type transistor is opposite to the case of a P-type transistor. The N-type transistor is turned on when a high level signal is applied to a control pole of the N-type transistor and is turned off when a low level signal is applied to the control pole of the N-type transistor, and the P-type transistor is turned on when a low level signal is applied to the control pole of the P-type transistor and is turned off when a high level signal is applied to the control pole of the P-type transistor.

Figure 1B:
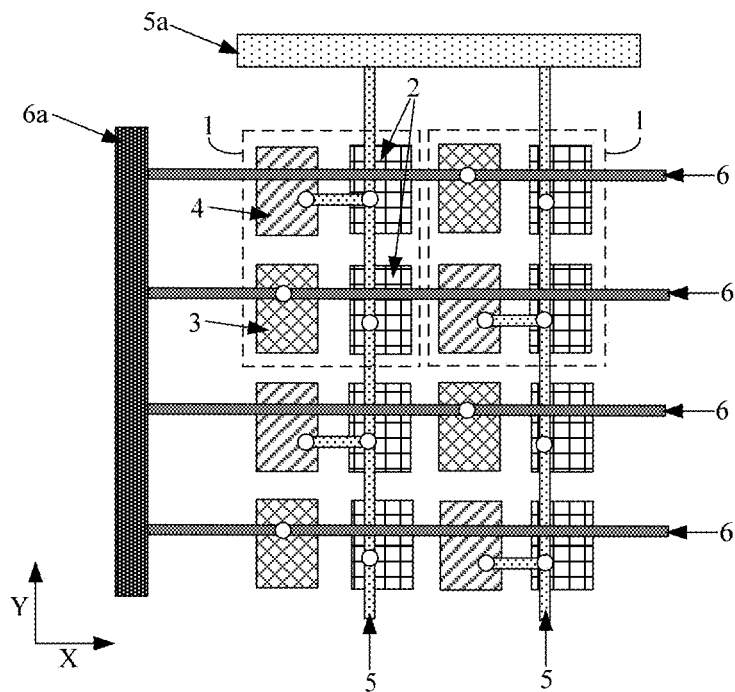
FIG. 1B is another schematic top view of a display substrate according to an embodiment of the present disclosure.

FIG. 1A is a schematic top view of a display substrate according to an embodiment of the present disclosure, and FIG. 1B is another schematic top view of a display substrate according to an embodiment of the present disclosure. As shown in FIGS. 1A and 1B, the display substrate includes: a base, and a plurality of pixel units 1 on a side of the base. The base includes: a display region, and a peripheral region surrounding the display region. The base may be a glass base, a quartz base, a plastic base, or the like. The plurality of pixel units 1 are located in the display region and arranged in an array by taking a first direction X (i.e., the horizontal direction in FIGS. 1A and 1B) as a row direction and a second direction Y (i.e., the vertical direction in FIGS. 1A and 1B) as a column direction. Each pixel unit 1 includes at least two sub-pixels each including: a pixel driving circuit and a light-emitting element. The light-emitting element includes: a first electrode, a light-emitting layer, and a second electrode arranged in sequence along a direction away from the base. Each sub-pixel is configured with a corresponding operating voltage transmission line, and the pixel driving circuit includes a driving transistor (not shown in FIGS. 1A and 1B) with a first pole electrically connected to the corresponding operating voltage transmission line, and a second pole electrically connected to the first electrode. The first electrode is located on a side of the driving transistor distal to the base, and the operating voltage transmission line is located between a layer structure where a control pole of the driving transistor is located and a layer structure where the first electrode is located.

The at least two sub-pixels included in each pixel unit 1 include: at least one first sub-pixel 2 and at least one second sub-pixel 3. The first sub-pixel 2 is configured with a first operating voltage transmission line 5, and the second sub-pixel 3 is configured with a second operating voltage transmission line 6. The first operating voltage transmission line 5 is insulated from the second operating voltage transmission line 6.

In other words, the first operating voltage transmission line 5 and the second operating voltage transmission line 6 may be disposed in any layer structure between the layer structure where the control pole of the driving transistor is located and the layer structure where the first electrode is located, independently and respectively. The first operating voltage transmission line 5 and the second operating voltage transmission line 6 may be disposed in a same layer or in different layers. In the present disclosure, it is enough to ensure that the first operating voltage transmission line 5 is insulated from the second operating voltage transmission line 6.

In an embodiment of the present disclosure, the first sub-pixel 2 and the second sub-pixel 3 in the pixel unit 1 are respectively configured with a first operating voltage transmission line 5 and a second operating voltage transmission line 6. The first operating voltage transmission line 5 is configured to transmit a first operating voltage, the second operating voltage transmission line 6 is configured to transmit a second operating voltage, and since the first operating voltage transmission line 5 is insulated from the second operating voltage transmission line 6, the first operating voltage may be different from the second operating voltage. That is, the operating voltage supplied to the pixel driving circuit in the first sub-pixel 2 may be different from the operating voltage supplied to the pixel driving circuit in the second sub-pixel 3. In other words, the actual driving voltage supplied to the corresponding light-emitting element by the pixel driving circuit in the first sub-pixel 2 may be different from the actual driving voltage supplied to the corresponding light-emitting element by the pixel driving circuit in the second sub-pixel 3. In practical applications, therefore, the first operating voltage and the second operating voltage may be designed according to a minimum driving voltage required for the light-emitting element in the first sub-pixel 2 and a minimum driving voltage required for the light-emitting element in the second sub-pixel 3, respectively.

For example, the first sub-pixel 2 is a green sub-pixel, and the second sub-pixel 3 is a blue sub-pixel and the first sub-pixel 2 includes a green light-emitting element (e.g., a green LED, a green QLED), and the second sub-pixel 3 includes a blue light-emitting element (e.g., a blue LED, a blue QLED). In general, the green light-emitting element requires a minimal driving voltage lower than a minimal driving voltage required for the blue light-emitting element, and therefore, the first operating voltage may be designed to be lower than the second operating voltage.

In some embodiments, a material of the light-emitting layer includes a quantum dot material, and in this case, the light-emitting device may be a quantum dot light-emitting diode. Alternatively, the light-emitting layer may be made of other materials, such as an organic material (in this case, the light-emitting device may be an organic light-emitting diode).

In some embodiments, each sub-pixel is configured with a corresponding data line electrically connected to the pixel driving circuit, and a layer structure where the data line is located is between the layer structure where the control pole of the driving transistor is located and the layer structure where the first electrode is located.

In some embodiments, the first operating voltage transmission line 5 is disposed in the same layer as the data line (not shown in FIGS. 1A and 1B), the second operating voltage transmission line 6 is disposed in the same layer as the data line, or located between the layer structure where the data line is located and the layer structure where the first electrode is located. The following detailed description will be given with reference to some specific examples.

It should be noted that, in the present disclosure, two or more structures disposed in a same layer specifically means that: the two or more structures are located in a same layer structure, and may be formed by performing a patterning process on a same thin film.

With continued reference to FIGS. 1A and 1B, in some embodiments, the at least two sub-pixels included in each pixel unit 1 further include: at least one third sub-pixel 4; and in a same pixel unit 1, the first sub-pixel 2 and the third sub-pixel 4 are configured with a same first operating voltage transmission line 5.

Figure 2:
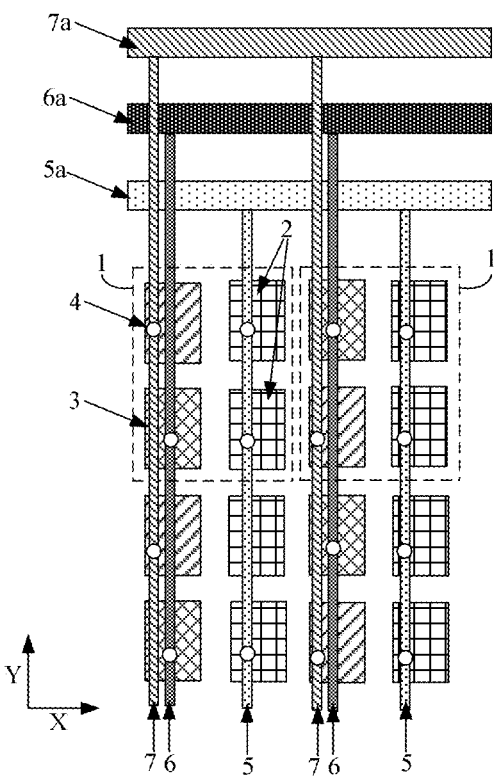
FIG. 2 is another schematic top view of a display substrate according to an embodiment of the present disclosure.

FIG. 2 is another schematic top view of a display substrate according to an embodiment of the present disclosure. As shown in FIG. 2, unlike the case shown in FIGS. 1A and 1B, in the case shown in FIG. 2, the third sub-pixel 4 is configured with a third operating voltage transmission line 7. The third operating voltage transmission line 7 is configured to transmit a third operating voltage, and is insulated from the first operating voltage transmission line 5 and the second operating voltage transmission line 6.

In other words, the first operating voltage transmission line 5, the second operating voltage transmission line 6, and the third operating voltage transmission line 7 may be disposed in any layer structure between the layer structure where the control pole of the driving transistor is located and the layer structure where the first electrode is located, independently and respectively. At least any two of the first operating voltage transmission line 5, the second operating voltage transmission line 6, and the third operating voltage transmission line 7 may be disposed in a same layer or in different layers. In the present disclosure, it is enough to ensure that any two of the first operating voltage transmission line 5, the second operating voltage transmission line 6, and the third operating voltage transmission line 7 are insulated from each other.

That is, the first sub-pixel 2, the second sub-pixel 3, and the third sub-pixel 4 are respectively configured with different operating voltage transmission lines that are mutually insulated from each other. In practical applications, therefore, the first operating voltage, the second operating voltage, and the third operating voltage may be individually designed according to a minimum driving voltage required for the light-emitting element in the first sub-pixel 2, a minimum driving voltage required for the light-emitting element in the second sub-pixel 3, and a minimum driving voltage required for the light-emitting element in the third sub-pixel 4.

In some embodiments, the first sub-pixel 2 is a green sub-pixel, the second sub-pixel 3 is a blue sub-pixel, and the third sub-pixel 4 is a red sub-pixel. The first sub-pixel 2 includes a green light-emitting element, the second sub-pixel 3 includes a blue light-emitting element, and the third sub-pixel 4 includes a red light-emitting element. In general, the red light-emitting element requires a minimal driving voltage lower than a minimal driving voltage required for the green light-emitting element, the green light-emitting element requires a minimal driving voltage lower than a minimal driving voltage required for the blue light-emitting element, and therefore, the third operating voltage may be designed to be lower than the first operating voltage, and the first operating voltage may be designed to be lower than the second operating voltage.

In some embodiments, the third operating voltage transmission line 7 is disposed in the same layer as the data line, or located between the layer structure where the data line is located and the layer structure where the first electrode is located. The following detailed description will be given with reference to specific examples.

In the peripheral region of the base, the corresponding first operating voltage peripheral lead 5a, second operating voltage peripheral lead 6a, and third operating voltage peripheral lead 7a may be provided. The first operating voltage transmission line 5 extends into the peripheral region and is electrically connected to the first operating voltage peripheral lead 5a, the second operating voltage transmission line 6 extends into the peripheral region and is electrically connected to the second operating voltage peripheral lead 6a, and the third operating voltage transmission line 7 extends into the peripheral region and is electrically connected to the third operating voltage peripheral lead 7a. A power-supply chip (not shown) may write corresponding operating voltages to the first operating voltage transmission line 5, the second operating voltage transmission line 6, and the third operating voltage transmission line 7 through the first operating voltage peripheral lead 5a, the second operating voltage peripheral lead 6a and the third operating voltage peripheral lead 7a, respectively.

It should be noted that the first operating voltage peripheral lead 5a, the second operating voltage peripheral lead 6a, and the third operating voltage peripheral lead 7a may be provided on a side of the display region independently and respectively. For example, in the case shown in FIG. 1A, the first operating voltage peripheral lead 5a and the display region are arranged in the second direction Y and the first operating voltage peripheral lead 5a extends in the first direction X, and the second operating voltage peripheral lead 6a and the display region are arranged in the second direction Y and the second operating voltage peripheral lead 6a extends in the first direction X. Then, the first operating voltage transmission line 5 and the second operating voltage transmission line 6 both extend in the second direction Y. In the case shown in FIG. 1B, the first operating voltage peripheral lead 5a and the display region are arranged in the second direction Y and the first operating voltage peripheral lead 5a extends in the first direction X, and the second operating voltage peripheral lead 6a and the display region are arranged in the first direction X and the second operating voltage peripheral lead 6a extends in the second direction Y. Then, the first operating voltage transmission line 5 extends in the second direction Y, and the second operating voltage transmission line 6 extends in the first direction X. For example, in the case shown in FIG. 2, the first operating voltage peripheral lead 5a and the display region are arranged in the second direction Y and the first operating voltage peripheral lead 5a extends in the first direction X, the second operating voltage peripheral lead 6a and the display region are arranged in the second direction Y and the second operating voltage peripheral lead 6a extends in the first direction X, and the third operating voltage peripheral lead 7a and the display region are arranged in the second direction Y and the third operating voltage peripheral lead 7a extends in the first direction X. Then, the first operating voltage transmission line 5, the second operating voltage transmission line 6 and the third operating voltage transmission line 7 all extend in the second direction Y.

It should be noted that in the case shown in each of FIGS. 1A and 1B, the third operating voltage peripheral lead 7a and the third operating voltage transmission line 7 are not provided.

With continued reference to FIGS. 1A, 1B, and 2, in some embodiments, all the pixel units 1 are arranged in an array taking the first direction X as a row direction and the second direction Y as a column direction. Each pixel unit 1 includes four sub-pixels, including two first sub-pixels 2, one second sub-pixel 3, and one third sub-pixel 4, and pixel driving circuits of the four sub-pixels in the pixel unit 1 are arranged in a 2×2 matrix taking the first direction as a row direction X and the second direction Y as a column direction. Among the four pixel driving circuits arranged in the 2×2 matrix in a same pixel unit 1, the pixel driving circuits of the two first sub-pixels 2 are arranged in one column, while the pixel driving circuit of the one second sub-pixel 3 and the pixel driving circuit of the one third sub-pixel 4 are arranged in the other column. In the array formed by the plurality of pixel units 1, two adjacent pixel units 1 in the row direction form a repeated unit in which two second sub-pixels 3 are located in different rows, and two third sub-pixels 4 are located in different rows, respectively.

It should be noted that the case where each pixel unit 1 shown in each of FIGS. 1A, 1B and 2 includes four sub-pixels and the four sub-pixels are arranged in a 2×2 matrix is merely an optional implementation of the present disclosure, and does not limit the technology of the present disclosure. In the present disclosure, it is enough to ensure that each pixel unit 1 includes at least one first sub-pixel 2 and at least one second sub-pixel 3.

Figure 3A:
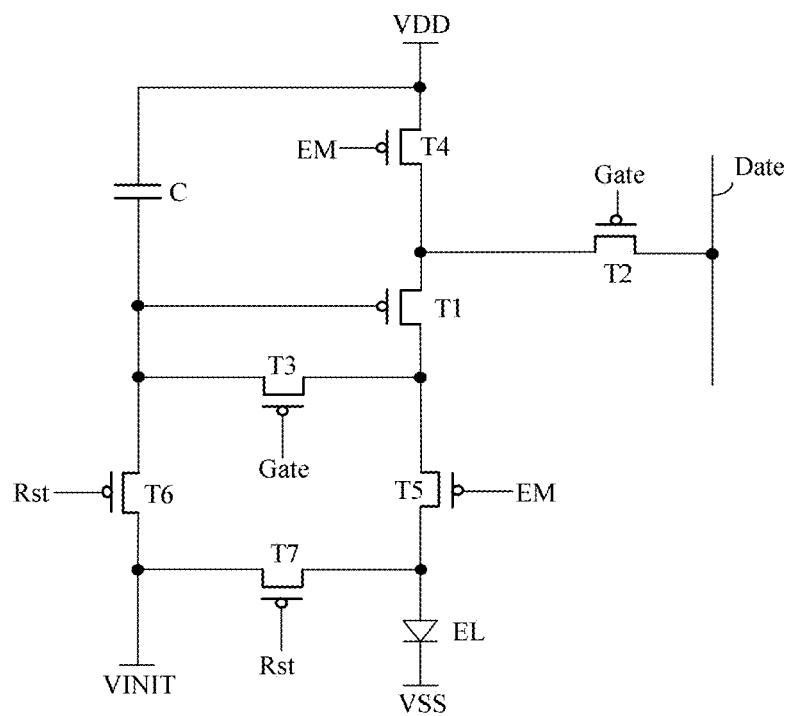
FIG. 3A is a schematic circuit diagram of a pixel driving circuit in a sub-pixel according to an embodiment of the present disclosure.
Figure 3B:
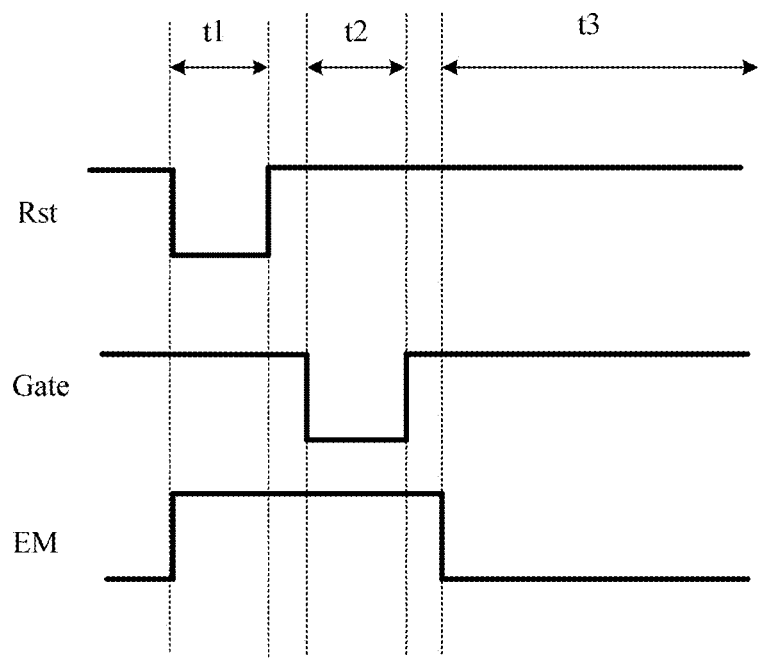
FIG. 3B is an operation timing diagram of the pixel driving circuit shown in FIG. 3A.

FIG. 3A is a schematic circuit diagram of a pixel driving circuit in a sub-pixel according to an embodiment of the present disclosure, and FIG. 3B is an operation timing diagram of the pixel driving circuit shown in FIG. 3A. As shown in FIGS. 3A and 3B, the pixel driving circuit includes not only a driving transistor T1, but also a storage capacitor C. The storage capacitor C has a first end plate electrically connected to a corresponding operating voltage transmission line, and a second end plate electrically connected to a control pole of the driving transistor T1. The driving transistor T1 has a first pole electrically connected to the corresponding operating voltage transmission line, and a second pole electrically connected to a first electrode of a light-emitting element EL.

In some embodiments, the pixel driving circuit further includes: a data write transistor T2, a threshold compensation transistor T3, a first reset transistor T6, a second reset transistor T7, a first light-emitting control transistor T4 and a second light-emitting control transistor T5. The first pole of the driving transistor T1 is electrically connected to the corresponding operating voltage transmission line through the first light-emitting control transistor T4, and the second pole of the driving transistor T1 is electrically connected to the first electrode of the light-emitting element EL through the second light-emitting control transistor T5.

The data write transistor T2 has a control pole electrically connected to a gate line Gate in a corresponding row, a first pole electrically connected to a data line Data in a corresponding column, and a second pole electrically connected to the first pole of the driving transistor T1.

The threshold compensation transistor T3 has a control pole electrically connected to a gate line Gate in a corresponding row, a first pole electrically connected to the second pole of the driving transistor T1 and a second pole electrically connected to the control pole of the driving transistor T1.

The first reset transistor T6 has a control pole electrically connected to a reset control signal line Rst in a corresponding row, a first pole electrically connected to a reset voltage transmission line, and a second pole electrically connected to the control pole of the driving transistor T1. The reset voltage transmission line provides a reset voltage VINIT.

The second reset transistor T7 has a control pole electrically connected to a reset control signal line Rst in a corresponding row, a first pole electrically connected to a reset voltage transmission line, and a second pole electrically connected to the first electrode.

The first light-emitting control transistor T4 has a control pole electrically connected to a light-emitting control signal line EM, a first pole electrically connected to the operating voltage transmission line, and a second pole electrically connected to the first pole of the driving transistor T1. The operating voltage transmission line provides an operating voltage VDD.

The second light-emitting control transistor T5 has a control pole electrically connected to a light-emitting control signal line EM, a first pole connected to the second pole of the driving transistor T1, and a second pole electrically connected to the first electrode 16 of the light-emitting element EL.

The operation process of the pixel driving circuit shown in FIG. 3A may be divided into 3 operation phases, i.e., t1 to t3, and the specific operation process of each transistor in the pixel driving circuit in each operation phase may be performed according to the timing sequence shown in FIG. 3B, which is not described in detail here.

It should be noted that, in an embodiment of the present disclosure, the pixel driving circuits in the first sub-pixel 2, the second sub-pixel 3, and the third sub-pixel 4 may adopt a same circuit structure, such as the circuit structure shown in FIG. 3A. Alternatively, the case where the pixel driving circuit using the 7T1C (7 transistors and 1 capacitor) shown in FIG. 3A is merely for exemplary purposes, and does not limit the technical solution of the present disclosure. In an embodiment of the present disclosure, the pixel driving circuit may adopt another structure having other numbers of transistors, such as a 7T2C structure, a 6T1C structure, a 6T2C structure, or a 9T2C structure, which is not limited in the embodiments of the present disclosure.

Figure 4:
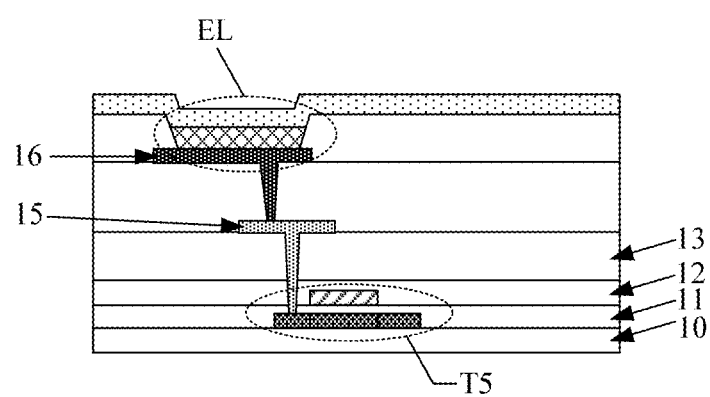
FIG. 4 is a cross-sectional view of a second light-emitting control transistor and a light-emitting device connected thereto according to an embodiment of the present disclosure.
Figure 5A:
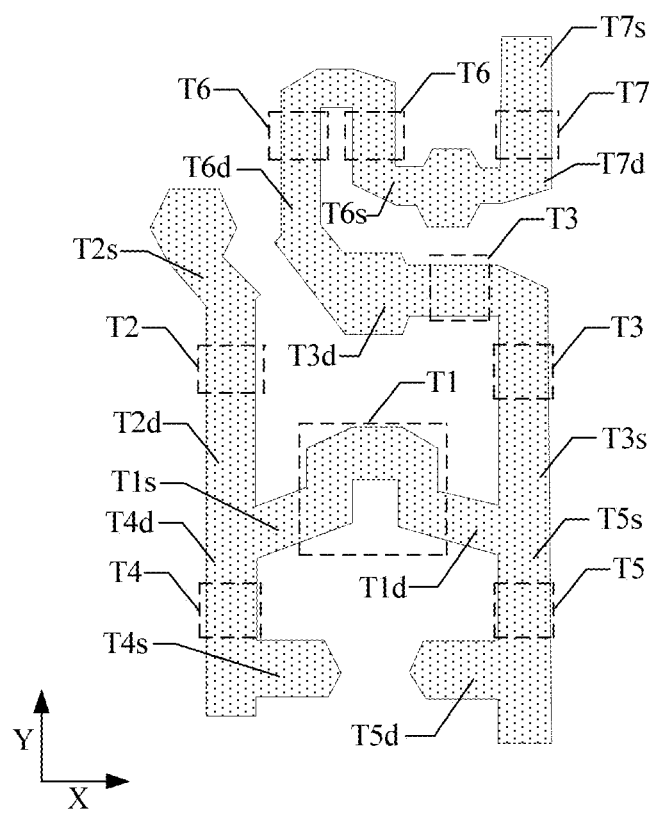
FIG. 5A is a layout of a portion of an active semiconductor layer corresponding to a region where a pixel driving circuit is located in an embodiment of the present disclosure.
Figure 5B:
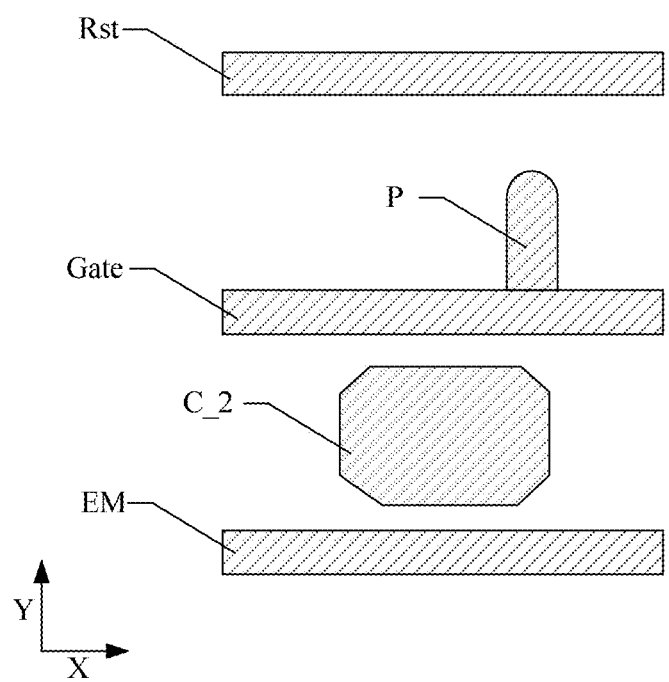
FIG. 5B is a layout of a portion of a first conductive layer corresponding to a region where a pixel driving circuit is located in an embodiment of the present disclosure.
Figure 5C:
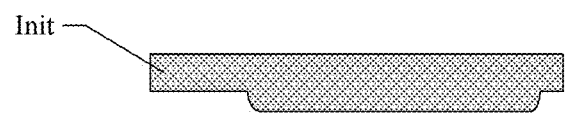
FIG. 5C is a layout of a portion of a second conductive layer corresponding to a region where a pixel driving circuit is located in an embodiment of the present disclosure.
Figure 5C:
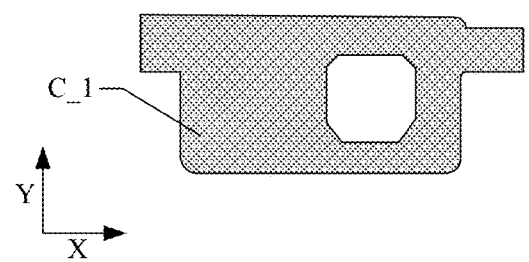
Figure 5D:
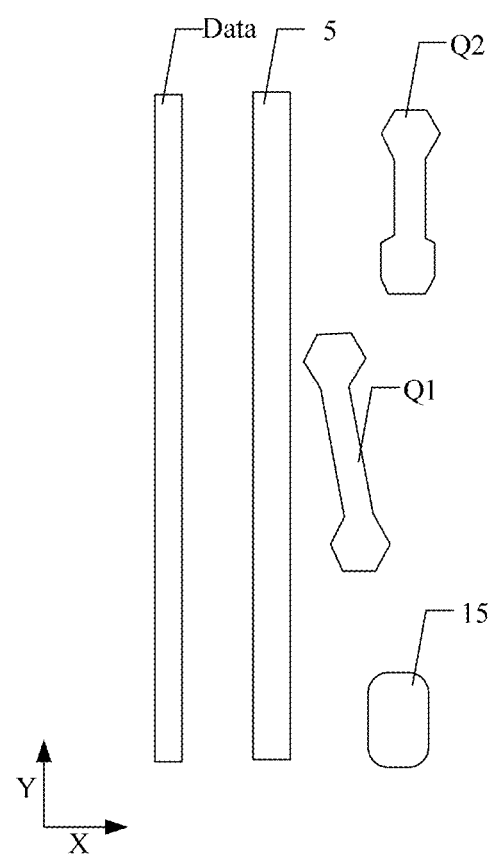
FIG. 5D is a layout of a portion of a third conductive layer corresponding to a region where a pixel driving circuit is located in an embodiment of the present disclosure.
Figure 5E:
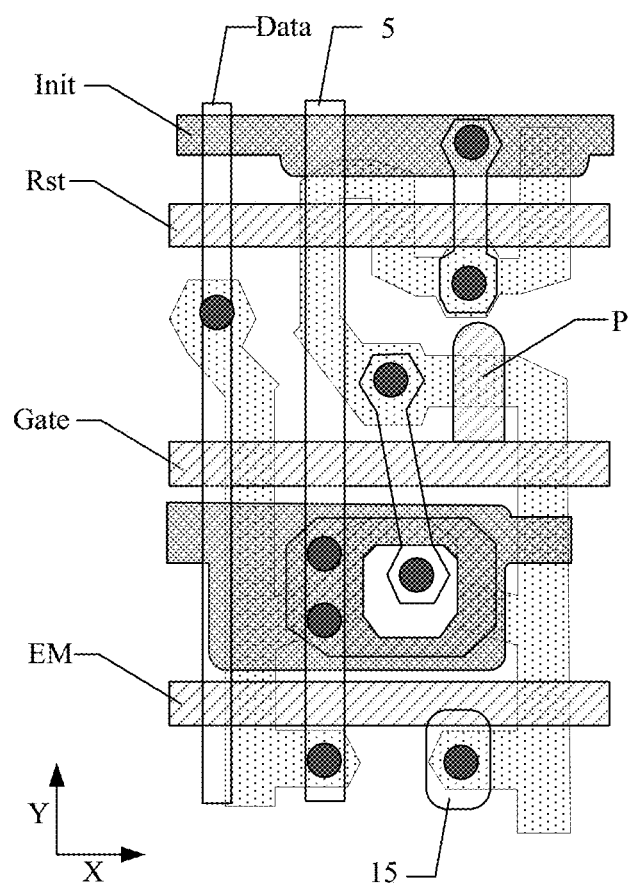
FIG. 5E is a layout of a region where a pixel driving circuit is located according to an embodiment of the present disclosure.

FIG. 4 is a cross-sectional view of the second light-emitting control transistor and a light-emitting device connected to the second light-emitting control transistor according to an embodiment of the present disclosure, FIG. 5A is a layout of a portion of an active semiconductor layer corresponding to a region where a pixel driving circuit is located in an embodiment of the present disclosure, FIG. 5B is a layout of a portion of a first conductive layer corresponding to a region where a pixel driving circuit is located in an embodiment of the present disclosure, FIG. 5C is a layout of a portion of a second conductive layer corresponding to a region where a pixel driving circuit is located in an embodiment of the present disclosure, FIG. 5D is a layout of a portion of a third conductive layer corresponding to a region where a pixel driving circuit is located in an embodiment of the present disclosure, and FIG. 5E is a layout of a region where a pixel driving circuit is located according to an embodiment of the present disclosure. As shown in FIGS. 4 to 5E, the display substrate includes: an active semiconductor layer, a gate insulation layer structure 11, a first conductive layer structure, a first insulation layer structure 12, a second conductive layer structure, a second insulation layer structure 13, and a third conductive layer structure sequentially arranged on a base 10 along a direction away from the base 10. In the region where a pixel driving circuit is located as shown in each of FIGS. 5A to 5E, the pixel driving circuit of the first sub-pixel 2 is taken as an example.

Referring to FIG. 5A, the active semiconductor layer includes: an active layer pattern (i.e., a channel region) and a source-drain doped region pattern (including a source region s and a drain region d) of each transistor in the pixel driving circuit. In FIG. 5A, a portion of the active semiconductor layer in the dotted-line rectangular box indicated by Tn represents the active layer pattern of a transistor Tn, Tns represents the source region of the transistor Tn, and Tnd represents the drain region of the transistor Tn, where 1≤n≤7 and n is a positive integer. Illustratively, a portion of the active semiconductor layer in the dotted-line rectangular box indicated by T1 represents the active layer pattern of the driving transistor T1. T1s represents the source region of the driving transistor T1, and T1d represents the drain region T1d of the driving transistor T1 and a portion of the active semiconductor layer in the dotted-line rectangular box indicated by T7 represents the active layer pattern of the second reset transistor T7, T7s represents the source region of the second reset transistor T7, and T7d represents the drain region T7d of the second reset transistor T7. The active layer patterns and source-drain doped region patterns of the transistors in a same pixel driving circuit are arranged to have a one-piece structure.

It should be noted that the active semiconductor layer may include a low-temperature polysilicon layer having a one-piece structure, in which the source region and the drain region of each transistor may be conductorized by doping or the like to implement electrical connection of the respective structures. That is, the active layer pattern and the source-drain doped region pattern of each transistor in each pixel driving circuit are an integral pattern formed by p-silicon, and active layer patterns of different transistors may be separated from each other by a doped structure.

For example, the active semiconductor layer may be made of amorphous silicon, polycrystalline silicon, an oxide semiconductor material, or the like. The source region and the drain region as described above may be regions doped with n-type impurities or p-type impurities.

Referring to FIG. 5B, the first conductive layer structure includes: the control pole of each transistor, the reset control signal line Rst, the gate line Gate, the second end plate C_2 of the storage capacitor C, and the light-emitting control signal line EM in the pixel driving circuit.

The control pole of the data write transistor T2 may be a portion of the gate line Gate where the gate line Gate overlaps the active semiconductor layer. The control pole of the first light-emitting control transistor T4 may be a first portion of the light-emitting control signal line EM where the light-emitting control signal line EM overlaps the active semiconductor layer, and the control pole of the second light-emitting control transistor T5 may be a second portion of the light-emitting control signal line EM where the light-emitting control signal line EM overlaps the active semiconductor layer. The control pole of the first reset transistor T6 is a first portion of the reset control signal line Rst where the reset control signal line Rst overlaps the active semiconductor layer, and the control pole of the second reset transistor T7 is a second portion of the reset control signal line Rst where the reset control signal line Rst overlaps the active semiconductor layer. The threshold compensation transistor T3 may be a thin film transistor of a dual gate electrode structure, a first control pole of the threshold compensation transistor T3 may be a portion of the gate line Gate where the gate line Gate overlaps the active semiconductor layer, and a second control pole of the threshold compensation transistor T3 may be a portion of a protrusion P protruding from the gate line Gate where the protrusion P overlaps the active semiconductor layer. The control pole of the driving transistor T1 may be the second end plate C_2 of the storage capacitor C. It should be noted that each dotted-line rectangular box in FIG. 5A also shows a portion of the first conductive layer where the first conductive layer overlaps the active semiconductor layer.

In some embodiments, the control pole of the data write transistor T2, the control pole of the threshold compensation transistor T3, the control pole of the first reset transistor T6, and the control pole of the second reset transistor T7 are each located on a first side of the control pole of the driving transistor T1: the control pole of the first light-emitting control transistor T4, and the control pole of the second light-emitting control transistor T5 are each located on a second side of the control pole of the driving transistor T1 and the first side and the second side are opposite sides in the second direction Y. For example, the first side is the upper side in each of FIGS. 5A to 5E, and the second side is the lower side in each of FIGS. 5A to 5E. The control pole of the data write transistor T2 and the control pole of the first light-emitting control transistor T4 are each located on a third side of the control pole of the driving transistor T1, the first control pole of the threshold compensation transistor T3, the control pole of the second light-emitting control transistor T5, and the control pole of the second reset transistor T7 are each located on a fourth side of the control pole of the driving transistor T1, and the third side and the fourth side are opposite sides in the first direction X. For example, the third side is the left side in each of FIGS. 5A to 5E, and the fourth side is the right side in each of FIGS. 5A to 5E.

With continued reference to FIG. 5B, the reset control signal line Rst, the gate line Gate, and the light-emitting control signal line EM all extend in the first direction X. In a same pixel driving circuit, the reset control signal line Rst configured for the pixel driving circuit is located on a first side of the configured gate line Gate, the gate line Gate configured for the pixel driving circuit is located on a first side of the second end plate C_2 of the storage capacitor C, and the light-emitting control signal line EM configured for the pixel driving circuit is located on a second side of the second end plate C_2 of the storage capacitor C. That is, in the same pixel driving circuit, the configured reset control signal line Rst, the configured gate line Gate, the second end plate C_2 of the storage capacitor C, and the configured light-emitting control signal line EM of the pixel driving circuit are sequentially arranged from top to bottom.

Referring to FIG. 5C, the second conductive layer structure includes: a reset voltage transmission line Init and a first end plate C_1 of the storage capacitor C. The reset voltage transmission line Init extends in the first direction X and a portion of the first end plate C_1 of the storage capacitor C and a portion of the second end plate C_2 of the storage capacitor C where they overlap each other may form a capacitor.

Referring to FIG. 5D, the third conductive layer structure includes: a data line Data and a first operating voltage transmission line 5 both extending in the second direction Y. For any one of the first sub-pixels 2, the data line Data configured for the first sub-pixel 2 is located on a third side of the first operating voltage transmission line 5 configured for the same first sub-pixel 2. For example, the data line Data configured for the first sub-pixel 2 is located on a left side of the first operating voltage transmission line 5 configured for the same first sub-pixel 2.

In addition, the third conductive layer structure is further provided with a first connection part Q1, a second connection part Q2 and a third connection part 15 all extending in the second direction Y. The first connection part Q1 is configured to be connected to the second pole of the threshold compensation transistor T3 and the control pole of the driving transistor T1, the second connection part Q2 is configured to be connected to the reset voltage transmission line and the first pole of the second reset transistor T7, and the third connection part 15 is configured to be connected to the first electrode 16 of the light-emitting element E and the second pole of the second light-emitting control transistor T5.

Figure 6:
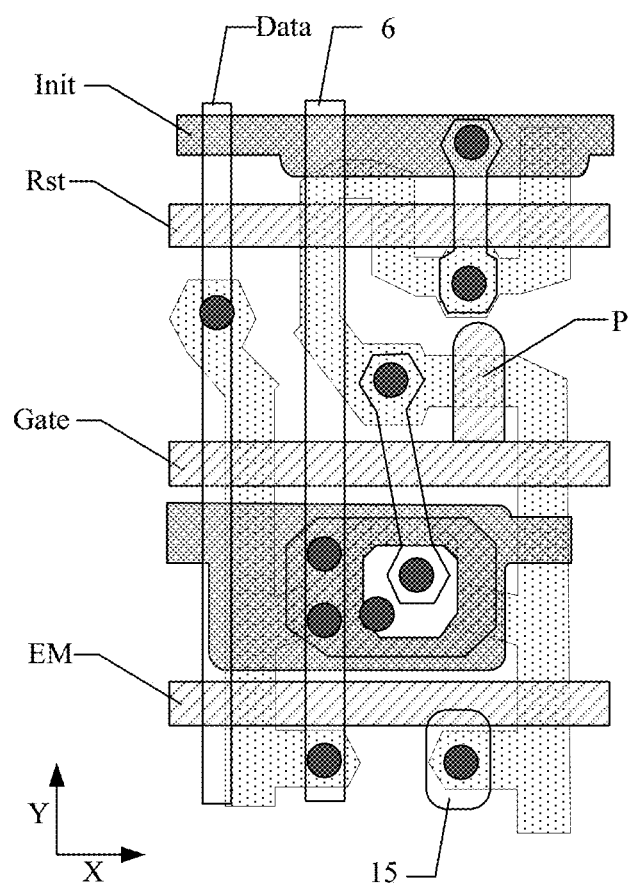
FIG. 6 is a layout of a portion of a region where a pixel driving circuit is located in a second sub-pixel according to an embodiment of the present disclosure.

FIG. 6 is a layout of a region where a pixel driving circuit in a second sub-pixel is located according to an embodiment of the present disclosure. As shown in FIG. 6, in some embodiments, the second operating voltage transmission line 6 extends in the second direction Y. For any one of the second sub-pixels 3, an orthogonal projection of the data line Data configured for the second sub-pixel 3 on the base 10 is located on a third side of the second operating voltage transmission line 6 configured for the same second sub-pixel 3.

Figure 7A:
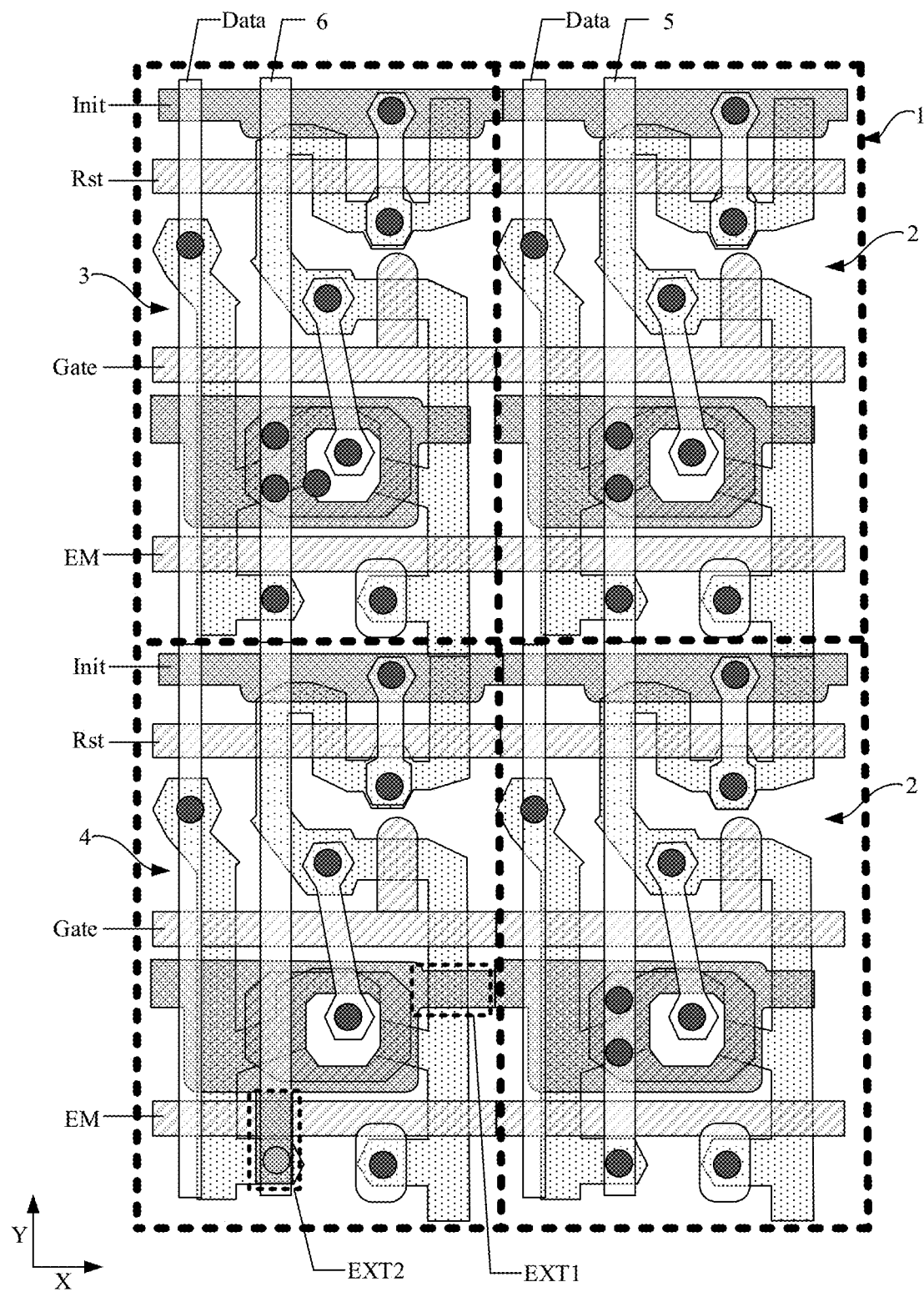
FIG. 7A is a layout of a region where a pixel unit is located according to an embodiment of the present disclosure.
Figure 7B:
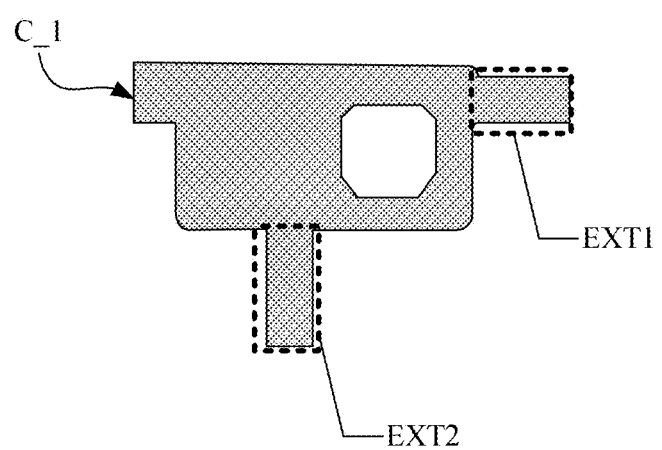
FIG. 7B is a schematic top view of a first end plate of a storage capacitor in the pixel driving circuit of a third sub-pixel in FIG. 7A.

FIG. 7A is a layout of a region where a pixel unit 1 is located according to an embodiment of the present disclosure, and FIG. 7B is a schematic top view of a first end plate C_1 of a storage capacitor C in the pixel driving circuit of the third sub-pixel 4 in FIG. 7A. As shown in FIGS. 7A and 7B, in some embodiments, in a same pixel unit 1, the first sub-pixels 2 and the third sub-pixel 4 are configured with a same first operating voltage transmission line 5. The first operating voltage transmission line has an orthogonal projection on the base 10 overlapped (or overlapping) with an orthogonal projection on the base 10 of the source-drain doped region pattern (the region indicated by T4s in FIG. 5A) corresponding to the first pole of the first light-emitting control transistor T4 in the pixel driving circuit of a corresponding first sub-pixel 2, and is connected to the source-drain doped region pattern corresponding to the first pole of the first light-emitting control transistor T4 in the pixel driving circuit of the corresponding first sub-pixel 2 through a via. The first end plate C_1 of the storage capacitor C in the pixel driving circuit of the third sub-pixel 4 includes a first extension part EXT1 and a second extension part EXT2. The first extension part EXT1 is directly connected to the first end plate C_1 of the storage capacitor C in the pixel driving circuit of an adjacent first sub-pixel 2 in the first direction X and located in the same pixel unit 1. The second extension part EXT2 has an orthogonal projection on the base 10 overlapped (or overlapping) with an orthogonal projection on the base 10 of the source-drain doped region pattern corresponding to the first pole of the first light-emitting control transistor T4 in the same pixel driving circuit, and is connected to the source-drain doped region pattern corresponding to the first pole of the first light-emitting control transistor T4 in the same pixel driving circuit through a via.

Figure 8:
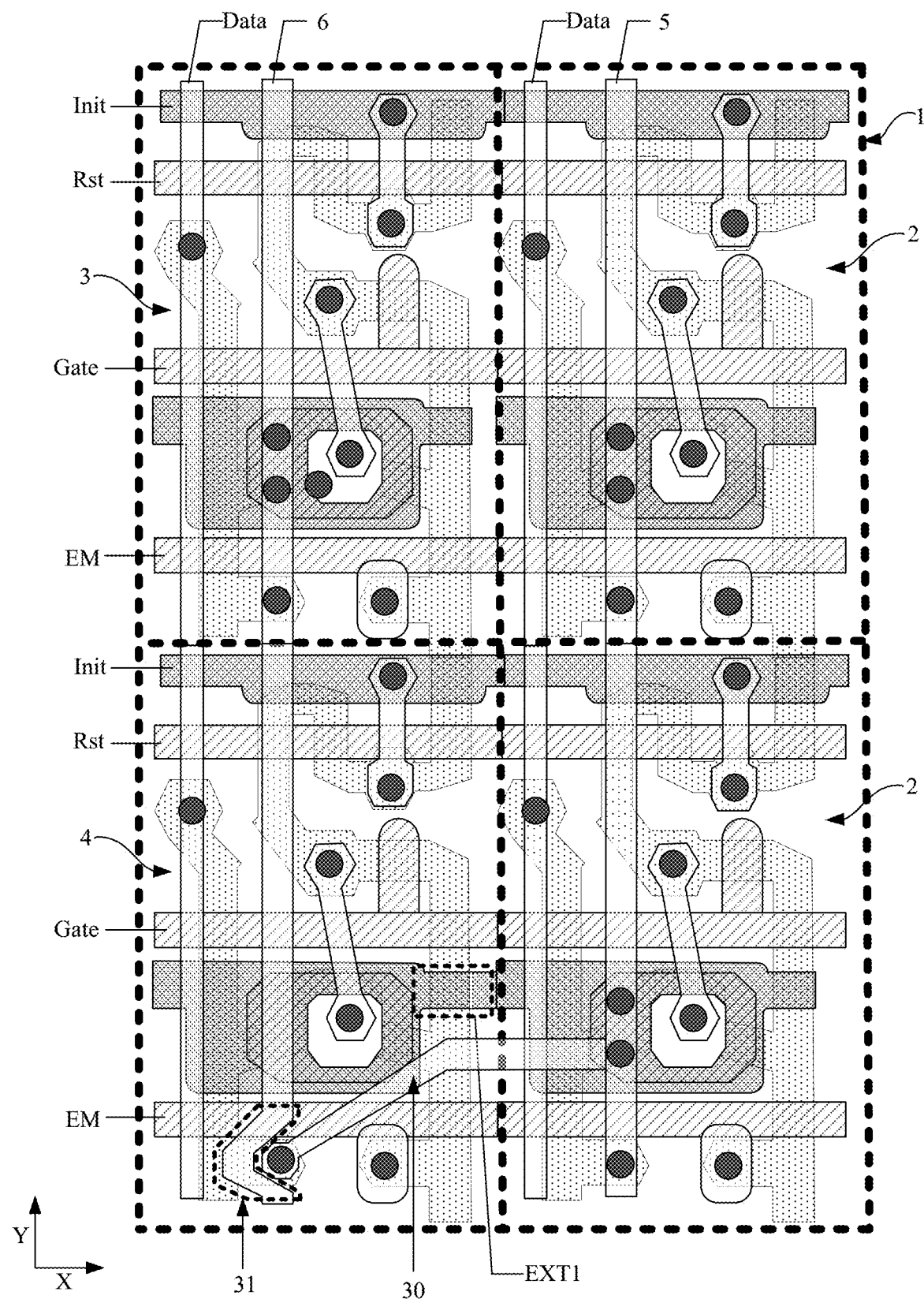
FIG. 8 is another layout of a region where a pixel unit is located according to an embodiment of the present disclosure.

FIG. 8 is another layout of a region where a pixel unit is located according to an embodiment of the present disclosure. As shown in FIG. 8, in some embodiments, in a same pixel unit 1, the first sub-pixels 2 and the third sub-pixel 4 are configured with a same first operating voltage transmission line 5. The first operating voltage transmission line 5 has an orthogonal projection on the base overlapped with an orthogonal projection on the base of the source-drain doped region pattern corresponding to the first pole of the first light-emitting control transistor T4 in the pixel driving circuit of a corresponding first sub-pixel 2, and is connected to the source-drain doped region pattern corresponding to the first pole of the first light-emitting control transistor T4 in the pixel driving circuit of the corresponding first sub-pixel 2 through a via. The first end plate C_1 of the storage capacitor C in the pixel driving circuit of the third sub-pixel 4 includes a first extension part EXT1 which is directly connected to the first end plate C_1 of the storage capacitor C in the pixel driving circuit of an adjacent first sub-pixel 2 in the first direction X and located in the same pixel unit 1. The second operating voltage transmission line 6 has an orthogonal projection on the base overlapped with an orthogonal projection on the base of the source-drain doped region pattern corresponding to the first pole of the first light-emitting control transistor T4 in the pixel driving circuit of a corresponding second sub-pixel 3, and is connected to the source-drain doped region pattern corresponding to the first pole of the first light-emitting control transistor T4 in the pixel driving circuit of the corresponding second sub-pixel 3 through a via. The source-drain doped region pattern corresponding to the first pole of the first light-emitting control transistor T4 in the pixel driving circuit of the third sub-pixel 4 is electrically connected to the first operating voltage transmission line 5 configured for the first sub-pixel 2 in the same pixel unit 1 through a conductive bridge line 30, and the conductive bridge line 30 is connected to the source-drain doped region pattern corresponding to the first pole of the first light-emitting control transistor T4 in the pixel driving circuit of the third sub-pixel 4 through a via.

With continued reference to FIG. 8, in some embodiments, the second operating voltage transmission line 6 is bent around the via through which the conductive bridge line 30 is connected to the source-drain doped region pattern corresponding to the first pole of the corresponding first light-emitting control transistor T4, and towards a side distal to the conductive bridge line 30 to form a protruding bypass structure 31.

Figure 9:
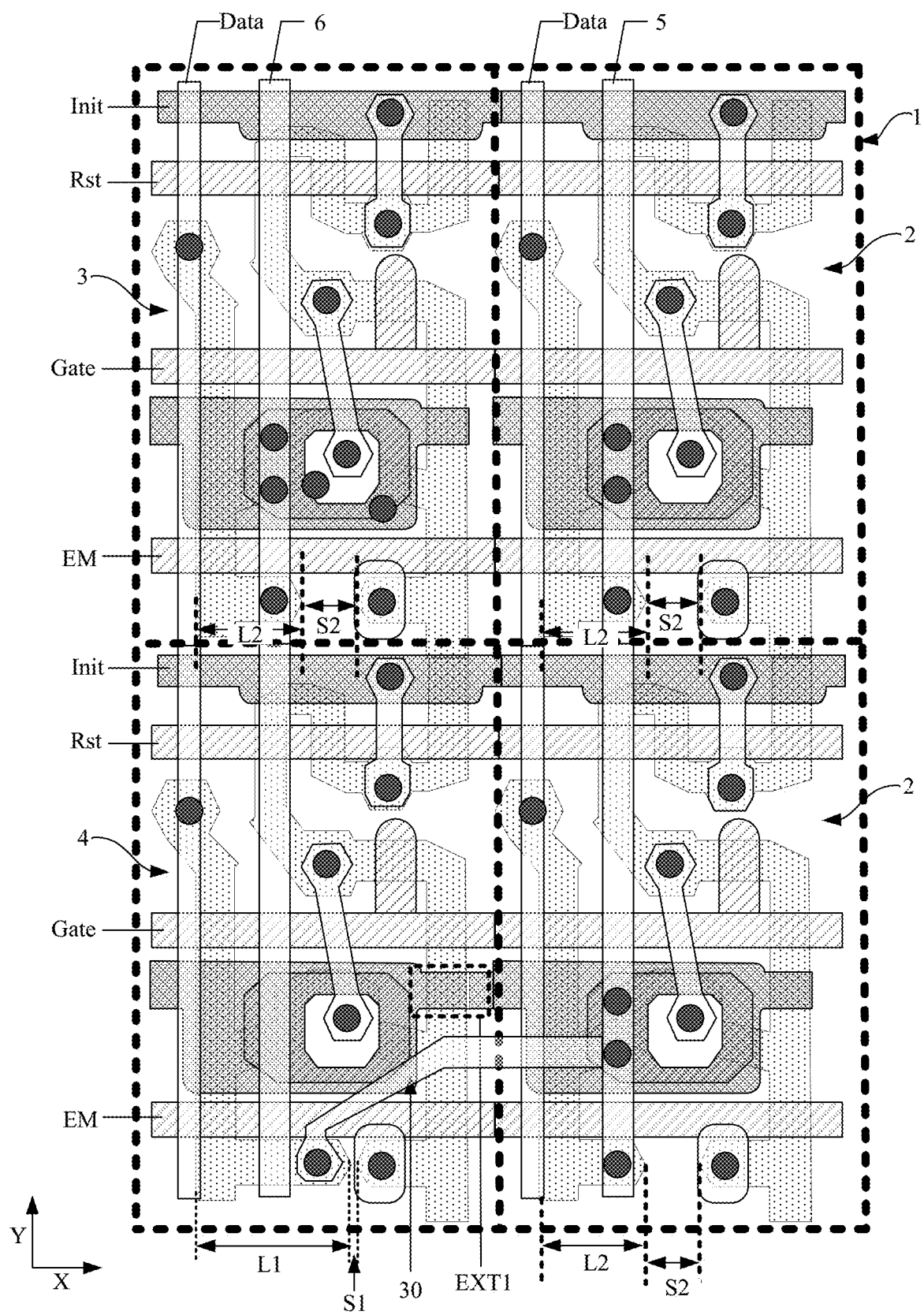
FIG. 9 is yet another layout of a region where a pixel unit is located according to an embodiment of the present disclosure.

FIG. 9 is yet another layout of a region where a pixel unit is located according to an embodiment of the present disclosure. As shown in FIG. 9, unlike the case shown in FIG. 8, the second operating voltage transmission line 6 in the case shown in FIG. 9 is straight, i.e., the second operating voltage transmission line 6 is not provided with the above-mentioned protruding bypass structure. Specifically, in a same pixel driving circuit, the source-drain doped region pattern (i.e., the region indicated by T4s in FIG. 5A) corresponding to the first pole of the first light-emitting control transistor T4 is disposed opposite to the source-drain doped region pattern (i.e., the region indicated by T5d in FIG. 5A) corresponding to the second pole of the second light-emitting control transistor T5 in the first direction X. In the pixel driving circuit of the third sub-pixel 4, the source-drain doped region pattern corresponding to the first pole of the first light-emitting control transistor T4 has a first length L1 in the first direction X. In the pixel driving circuit of the first sub-pixel 2 or the second sub-pixel 3, the source-drain doped region pattern corresponding to the first pole of the first light-emitting control transistor T4 has a second length L2 smaller than the first length L1 in the first direction X. In the pixel driving circuit of the third sub-pixel 4, the source-drain doped region pattern corresponding to the first pole of the first light-emitting control transistor T4 is spaced apart from the source-drain doped region pattern corresponding to the second pole of the second light-emitting control transistor T5 by a first interval S1 in the first direction X. In the pixel driving circuit of the second sub-pixel 3, the source-drain doped region pattern corresponding to the first pole of the first light-emitting control transistor T4 is spaced apart from the source-drain doped region pattern corresponding to the second pole of the second light-emitting control transistor T5 by a second interval S2 in the first direction X, where the first interval S1 is smaller than the second interval S2. That is, the source-drain doped region pattern (i.e., the region indicated by T4s in FIG. 5A) corresponding to the first pole of the first light-emitting control transistor T4 in the pixel driving circuit of the third sub-pixel 4 is extended, so as to be beneficial to being connected with the conductive bridge line 30 through the via.

Figure 10:
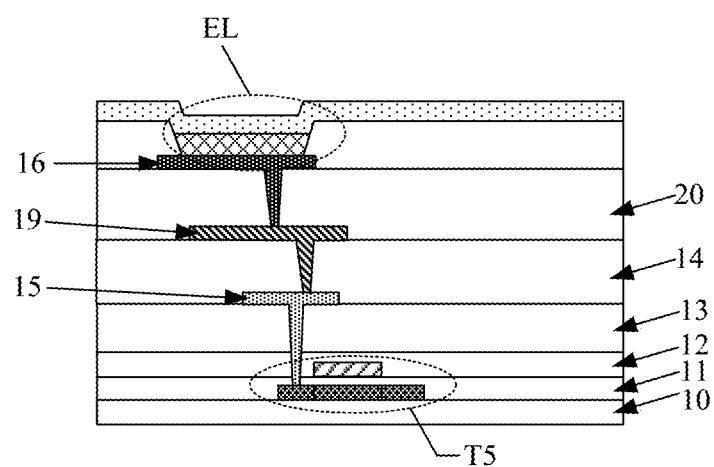
FIG. 10 is another cross-sectional view of a second light-emitting control transistor and a light-emitting device connected thereto according to an embodiment of the present disclosure.

FIG. 10 is another cross-sectional view of a second light-emitting control transistor and a light-emitting element connected to the second light-emitting control transistor according to an embodiment of the present disclosure. Referring to FIG. 10, in some embodiments, a third insulation layer structure 14, a fourth conductive layer structure, and a fourth insulation layer structure 20 are sequentially arranged between the third conductive layer structure and the layer structure where the first electrode 16 is located in a direction away from the base. The third conductive layer structure includes a third connection part 15, the fourth conductive layer structure includes a fourth connection part 19, and the second pole of the second light-emitting control transistor T5 is electrically connected to the first electrode 16 of the light-emitting element EL through the third connection part 15 and the fourth connection part 19 sequentially; and the fourth conductive layer structure further includes the conductive bridge line 30 shown in FIGS. 8 and 9.

Figure 11:
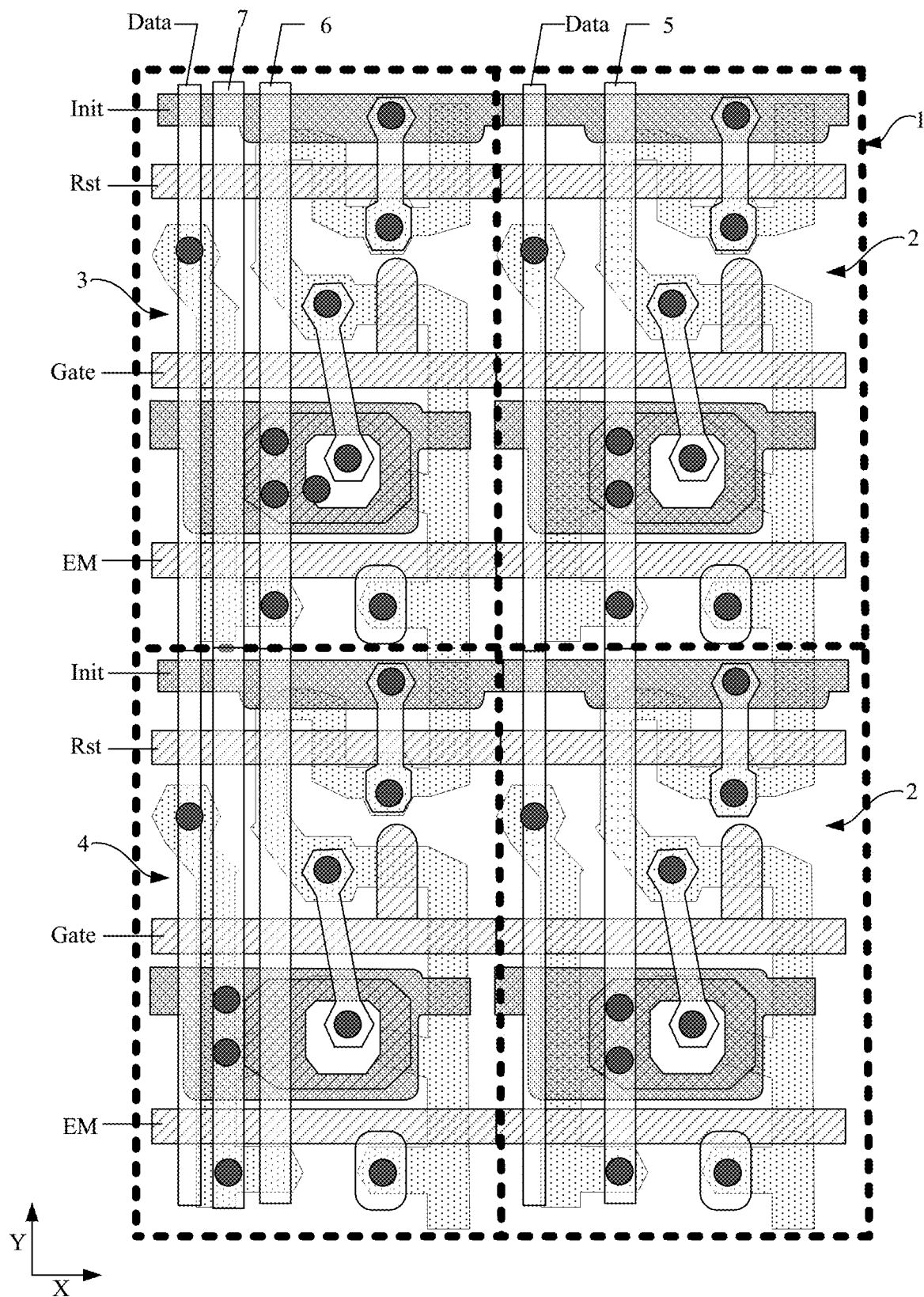
FIG. 11 is still another layout of a region where a pixel unit is located according to an embodiment of the present disclosure.

FIG. 11 is still another layout of a region where a pixel unit is located according to an embodiment of the present disclosure. As shown in FIG. 11, unlike the case shown in each of FIGS. 8 and 9, in the case shown in FIG. 11, the third sub-pixel 4 is configured with a third operating voltage transmission line 7, and the third operating voltage transmission line 7 is insulated from the first operating voltage transmission line 5 and the second operating voltage transmission line 6.

More specifically, the first operating voltage transmission line 5 has an orthogonal projection on the base 10 overlapped with an orthogonal projection on the base 10 of the source-drain doped region pattern corresponding to the first pole of the first light-emitting control transistor T4 in the pixel driving circuit of a corresponding first sub-pixel 2, and is connected to the source-drain doped region pattern corresponding to the first pole of the first light-emitting control transistor T4 in the pixel driving circuit of the corresponding first sub-pixel 2 through a via. The second operating voltage transmission line 6 has an orthogonal projection on the base overlapped with an orthogonal projection on the base of the source-drain doped region pattern corresponding to the first pole of the first light-emitting control transistor T4 in the pixel driving circuit of a corresponding second sub-pixel 3, and is connected to the source-drain doped region pattern corresponding to the first pole of the first light-emitting control transistor T4 in the pixel driving circuit of the corresponding second sub-pixel 3 through a via. The third operating voltage transmission line 7 has an orthogonal projection on the base overlapped with an orthogonal projection on the base of the source-drain doped region pattern corresponding to the first pole of the first light-emitting control transistor T4 in the pixel driving circuit of a corresponding third sub-pixel 4, and is connected to the source-drain doped region pattern corresponding to the first pole of the first light-emitting control transistor T4 in the pixel driving circuit of the corresponding third sub-pixel 4 through a via. The data line Data, the first operating voltage transmission line 5, the second operating voltage transmission line 6 and the third operating voltage transmission line 7 all extend in the second direction Y.

In a same pixel unit 1, the third sub-pixel 4 and the second sub-pixel 3 are configured with a same data line Data which has on the base 10 an orthogonal projection located on a third side of the orthogonal projection of the third operating voltage transmission line 7 configured for the third sub-pixel 4 on the base 10, and the orthogonal projection of the third operating voltage transmission line 7 configured for the third sub-pixel 4 on the base 10 is located on a third side of the orthogonal projection of the second operating voltage transmission line 6 configured for the second sub-pixel 3 on the base 10.

Figure 12:
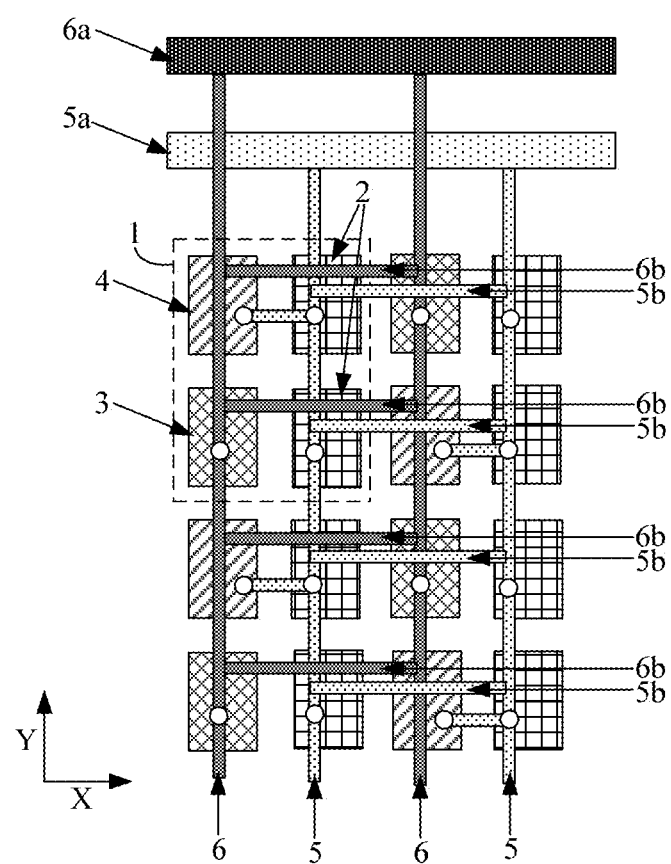
FIG. 12 is another schematic top view of a display substrate according to an embodiment of the present disclosure.

FIG. 12 is another schematic top view of a display substrate according to an embodiment of the present disclosure. As shown in FIG. 12, unlike the case shown in each of FIGS. 1A and 1B, the display substrate shown in FIG. 12 further includes a plurality of first operating voltage connection lines 5b extending in a direction crossed (or crossing) with an extending direction of the first operating voltage transmission line 5, and each first operating voltage connection line 5b is electrically connected to at least two first operating voltage transmission lines 5 and each first operating voltage connection line 5b is disposed in the same layer as the first end plate C_1 of the storage capacitor C.

In some embodiments, the display substrate further includes: a plurality of second operating voltage connection lines 6b extending in a direction crossed (or crossing) with an extending direction of the second operating voltage transmission line 6, and each second operating voltage connection line 6b is electrically connected to at least two second operating voltage transmission lines 6. Each second operating voltage connection line 6b is disposed in the same layer as the first end plate C_1 of the storage capacitor C or disposed in the same layer as the first electrode, or located between the layer structure where the first end plate C_1 of the storage capacitor C is located and the layer structure where the first electrode 16 of the light-emitting element EL is located.

The wiring of the first operating voltage connection lines 5b and the second operating voltage connection lines 6b will be exemplarily described below with reference to specific embodiments.

Figure 13A:
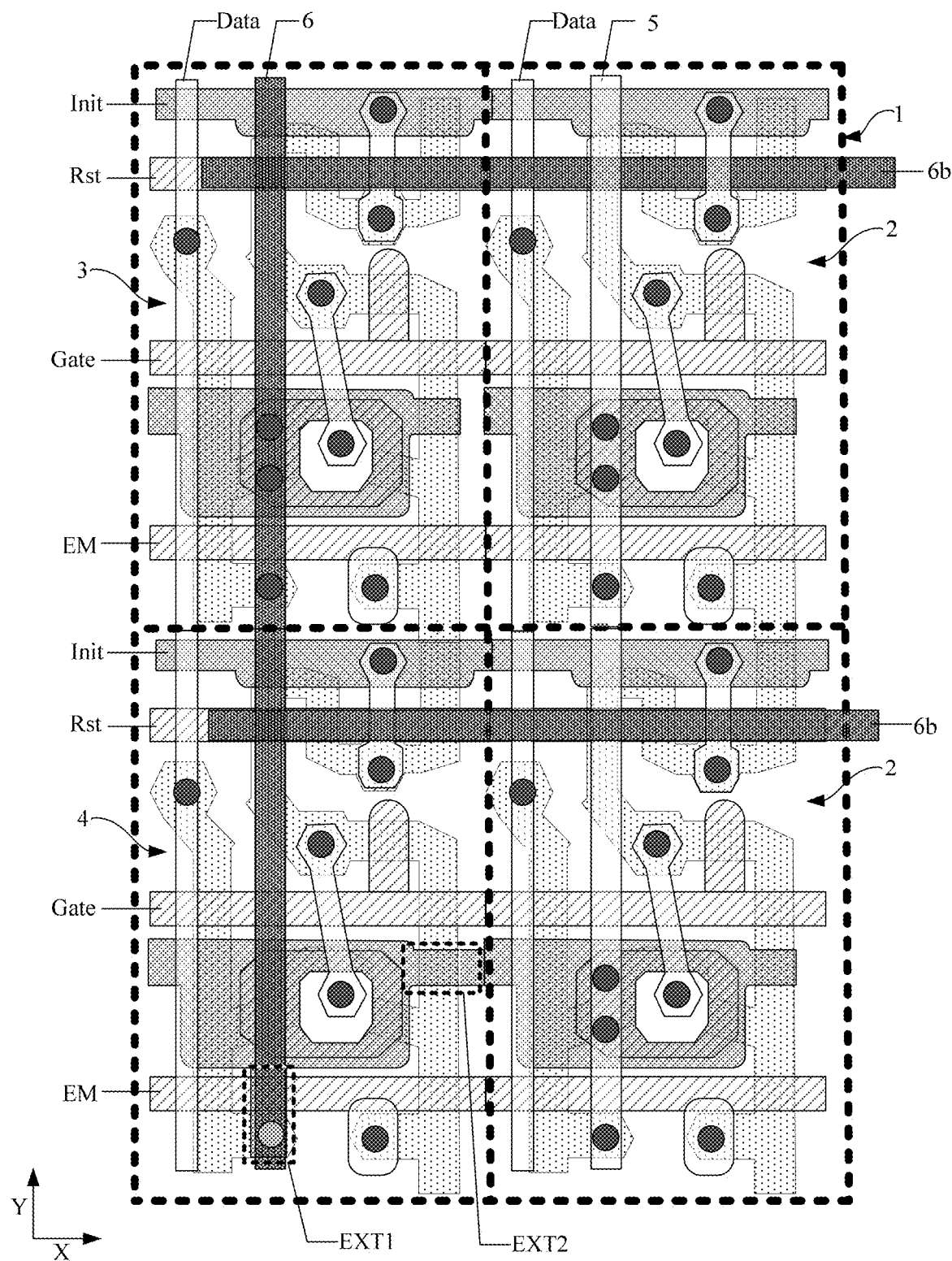
FIG. 13A is still another layout of a region where a pixel unit is located according to an embodiment of the present disclosure.

FIG. 13A is still another layout of a region where a pixel unit is located according to an embodiment of the present disclosure. As shown in FIGS. 3A and 13A, in some embodiments, the pixel driving circuit further includes: a first reset transistor T6 and/or a second reset transistor T7. The first reset transistor T6 has a control pole electrically connected to a reset control signal line Rst in a corresponding row, a first pole electrically connected to a reset voltage transmission line Init, and a second pole electrically connected to the control pole of the driving transistor T1. The second reset transistor T7 has a control pole electrically connected to a reset control signal line Rst in a corresponding row, a first pole electrically connected to a reset voltage transmission line Init, and a second pole electrically connected to the first electrode. The reset control signal line Rst is disposed in the same layer as the second end plate C_2 of the storage capacitor C and extends in the first direction X, the reset voltage transmission line Init is disposed in the same layer as the first end plate C_1 of the storage capacitor C and extends in the first direction X, and an orthogonal projection of the reset control signal line Rst on the base 10 is not overlapped (or does not overlap) with an orthogonal projection of the reset voltage transmission line Init on the base 10. The second operating voltage transmission line 6 is located between the layer structure where the first end plate C_1 of the storage capacitor C is located and the layer structure where the first electrode of the light-emitting element EL is located. For example, the second operating voltage transmission line 6 is located in the fourth conductive layer structure as described above. The second operating voltage transmission line 6 extends in the first direction X. The second operating voltage transmission line 6 has on the base 10 an orthogonal projection located in a coverage region of an orthogonal projection of the reset voltage transmission line Init on the base 10 (not shown in the figures), or located in a coverage region of an orthogonal projection of the reset control signal line Rst on the base 10 (shown in FIG. 13A).

Figure 13B:
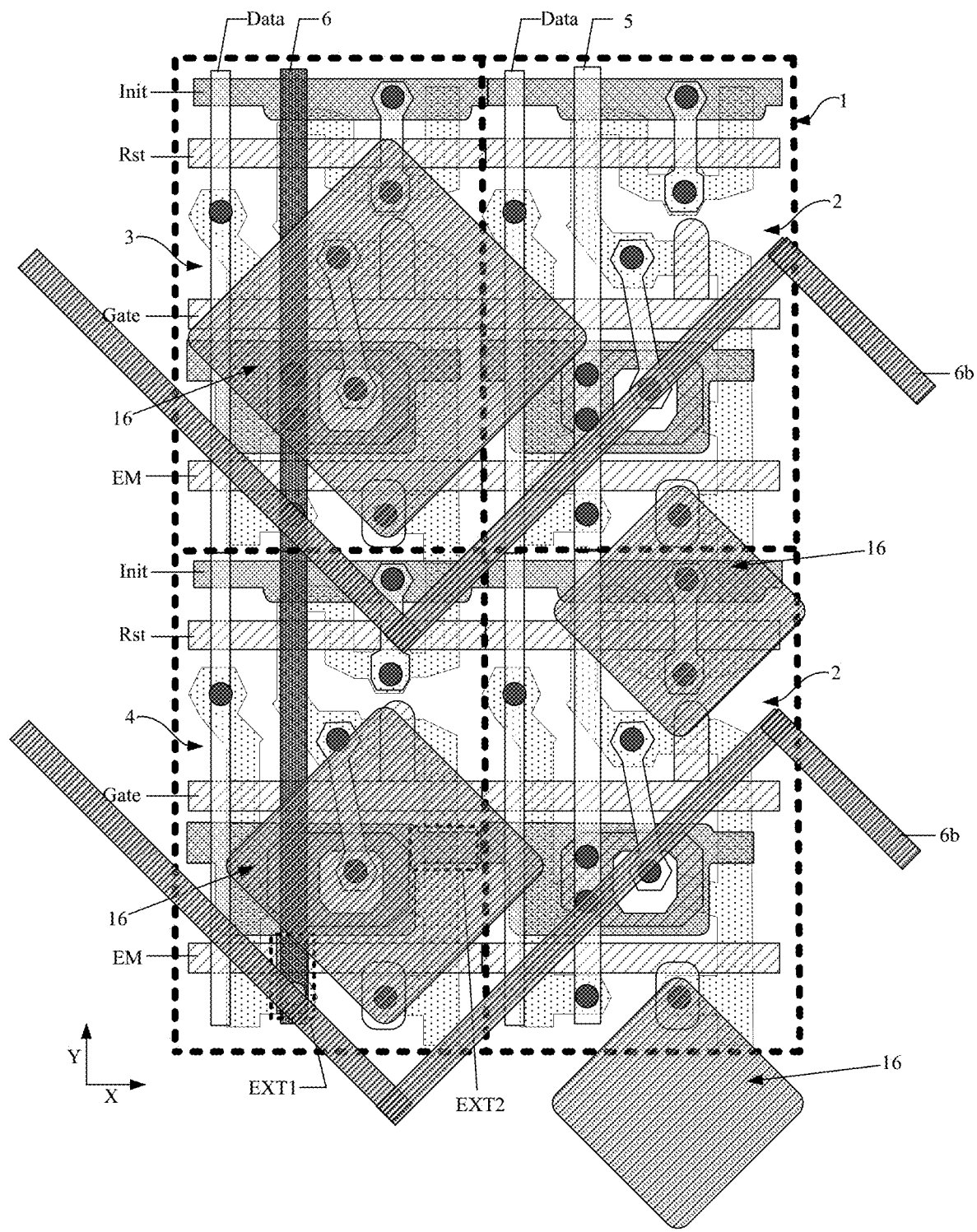
FIG. 13B is still another layout of a region where a pixel unit is located according to an embodiment of the present disclosure.

FIG. 13B is still another layout of a region where a pixel unit is located according to an embodiment of the present disclosure. As shown in FIG. 13B, in the case shown in FIG. 13B, each first operating voltage connection line 5b is disposed in the same layer as the first end plate C_1 of the storage capacitor C, and each second operating voltage connection line 6b is disposed in the same layer as the first electrode 16 of the light-emitting element EL. As an optional implementation, each first operating voltage connection line 5b is in the form of a meander line (or a folded line).

It should be noted that when the second operating voltage connection line 6b is disposed in the same layer as the first electrode 16, it is enough to ensure that the second operating voltage connection line 6b is insulated from each first electrode 16.

In some embodiments, in a same pixel unit 1, the first sub-pixel 2 and the third sub-pixel 4 are configured with a same first operating voltage transmission line 5. The display substrate further includes: a plurality of first operating voltage connection lines 5b and a plurality of second operating voltage connection lines 6b. The plurality of first operating voltage connection lines 5b and the plurality of second operating voltage connection lines 6b both extend in the first direction X, the first operating voltage transmission line 5 and the second operating voltage transmission line 6 both extend in the second direction Y, each first operating voltage connection line 5b is electrically connected to at least two first operating voltage transmission lines 5, and each second operating voltage connection line 6b is electrically connected to at least two second operating voltage transmission lines 6. Each first operating voltage connection line 5b and each second operating voltage connection line 6b are disposed in the same layer as the first end plate C_1 of the storage capacitor C (i.e., in the second conductive layer structure).

Figure 14:
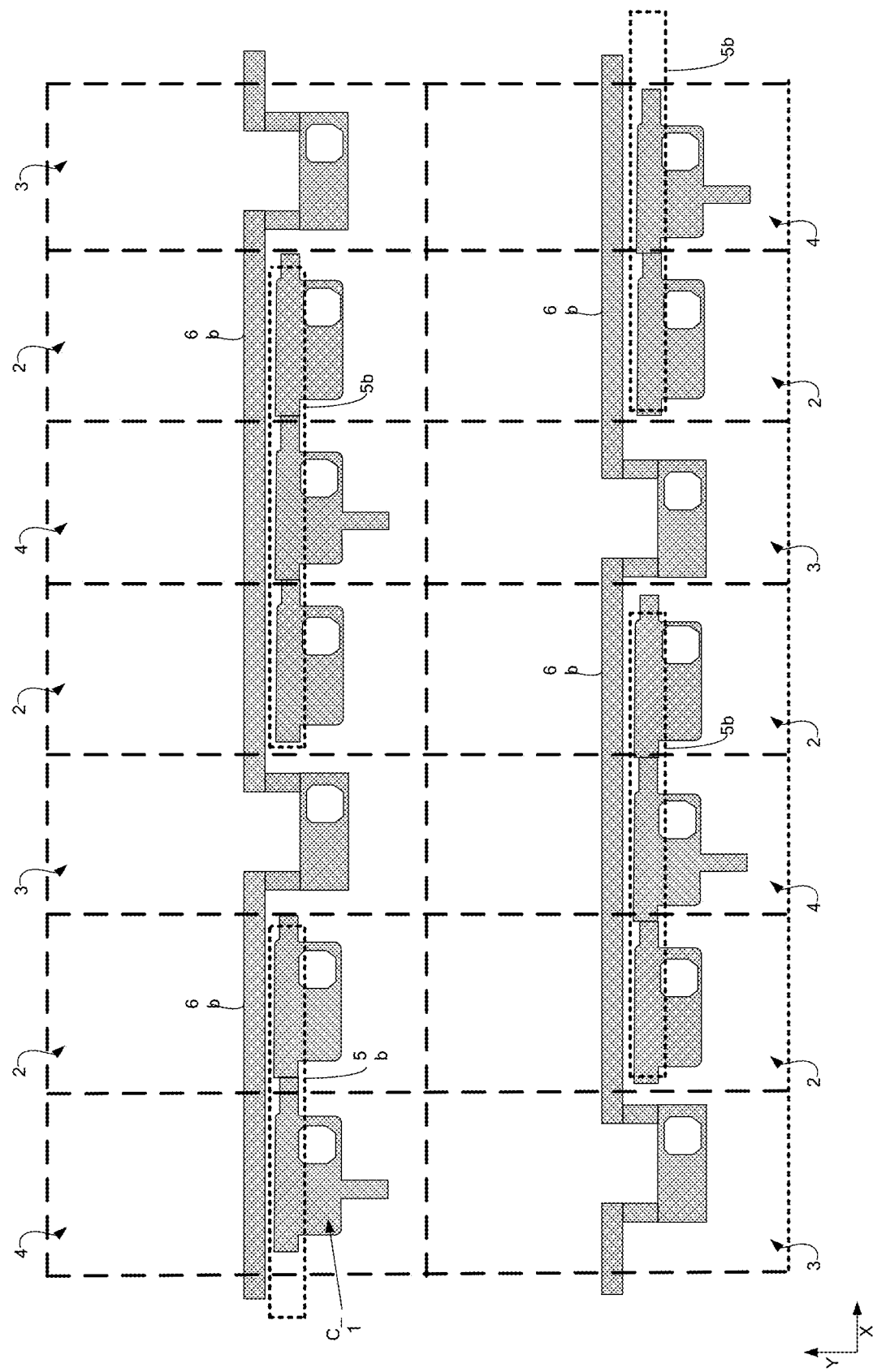
FIG. 14 is a layout of a layer structure where the first end plate of the storage capacitor is located according to an embodiment of the present disclosure.

FIG. 14 is a layout of a layer structure where the first end plate of the storage capacitor is located according to an embodiment of the present disclosure. As shown in FIG. 14, in some embodiments, in any row of the sub-pixels, first end plates C_1 of two storage capacitors C in any two adjacent second sub-pixels 3 are connected together through one of the second operating voltage connection lines 6b, and first end plates of three storage capacitors C_1 in two first sub-pixels 2 and one third sub-pixel 4 between two adjacent second sub-pixels 3 are connected together through one of the first operating voltage connection lines 5b.

Figure 15:
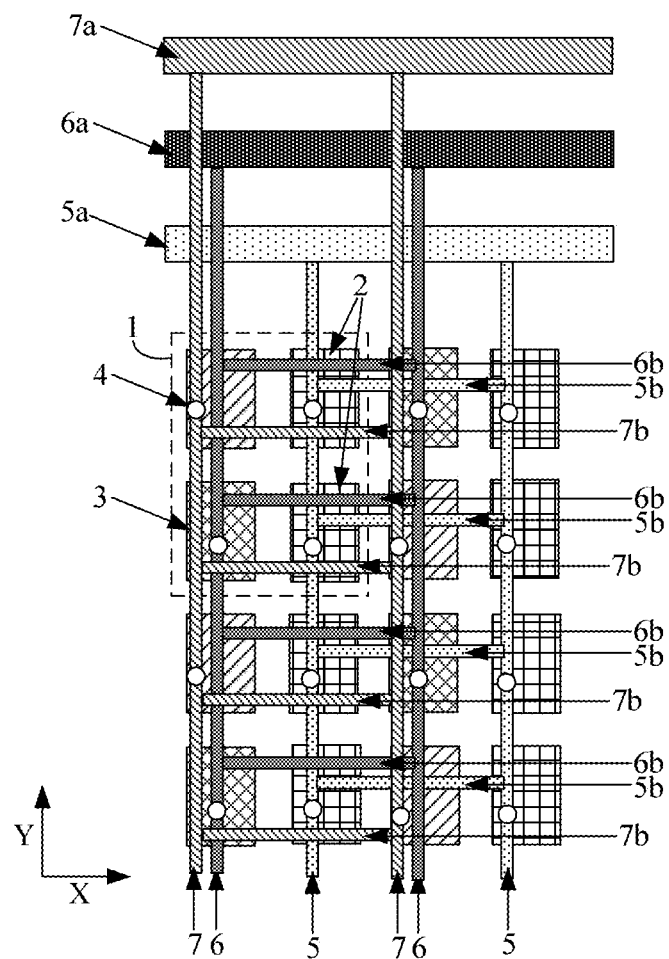
FIG. 15 is still another schematic top view of a display substrate according to an embodiment of the present disclosure.

FIG. 15 is still another schematic top view of a display substrate according to an embodiment of the present disclosure. As shown in FIG. 15, unlike the case shown in FIG. 2, the display substrate shown in FIG. 15 further includes: a plurality of third operating voltage connection lines 7b extending in a direction crossed with an extending direction of the third operating voltage transmission line 7, and each third operating voltage connection line 7b is electrically connected to at least two third operating voltage transmission lines 7. Each third operating voltage connection line 7b is disposed in the same layer as the first end plate C_1 of the storage capacitor C, or disposed in the same layer as the first electrode, or located between the layer structure where the first end plate C_1 of the storage capacitor C is located and the layer structure where the first electrode is located.

In the embodiments of the present disclosure, by providing the first/second/third operating voltage connection lines for the corresponding first/second/third operating voltage transmission lines, it is beneficial to maintaining and improving the voltage uniformity at different positions of the first/second/third operating voltage transmission lines.

In some embodiments, the third sub-pixel 4 is configured with a third operating voltage transmission line 7. The display substrate further includes: a plurality of first operating voltage connection lines 5b, a plurality of second operating voltage connection lines 6b, and a plurality of third operating voltage connection lines 7b. The plurality of first operating voltage connection lines 5b, the plurality of second operating voltage connection lines 6b and the plurality of third operating voltage connection lines 7b all extend in the first direction X. The first operating voltage transmission line 5, the second operating voltage transmission line 6 and the third operating voltage transmission line 7 all extend in the second direction Y. Each first operating voltage connection line 5b is electrically connected to at least two first operating voltage transmission lines 5, each second operating voltage connection line 6b is electrically connected to at least two second operating voltage transmission lines 6, and each third operating voltage connection line 7b is electrically connected to at least two third operating voltage transmission lines 7. Each first operating voltage connection line 5b, each second operating voltage connection line 6b and each third operating voltage connection line 7b are disposed in the same layer as the first end plate C_1 of the storage capacitor C (i.e., in the second conductive layer structure).

Figure 16:
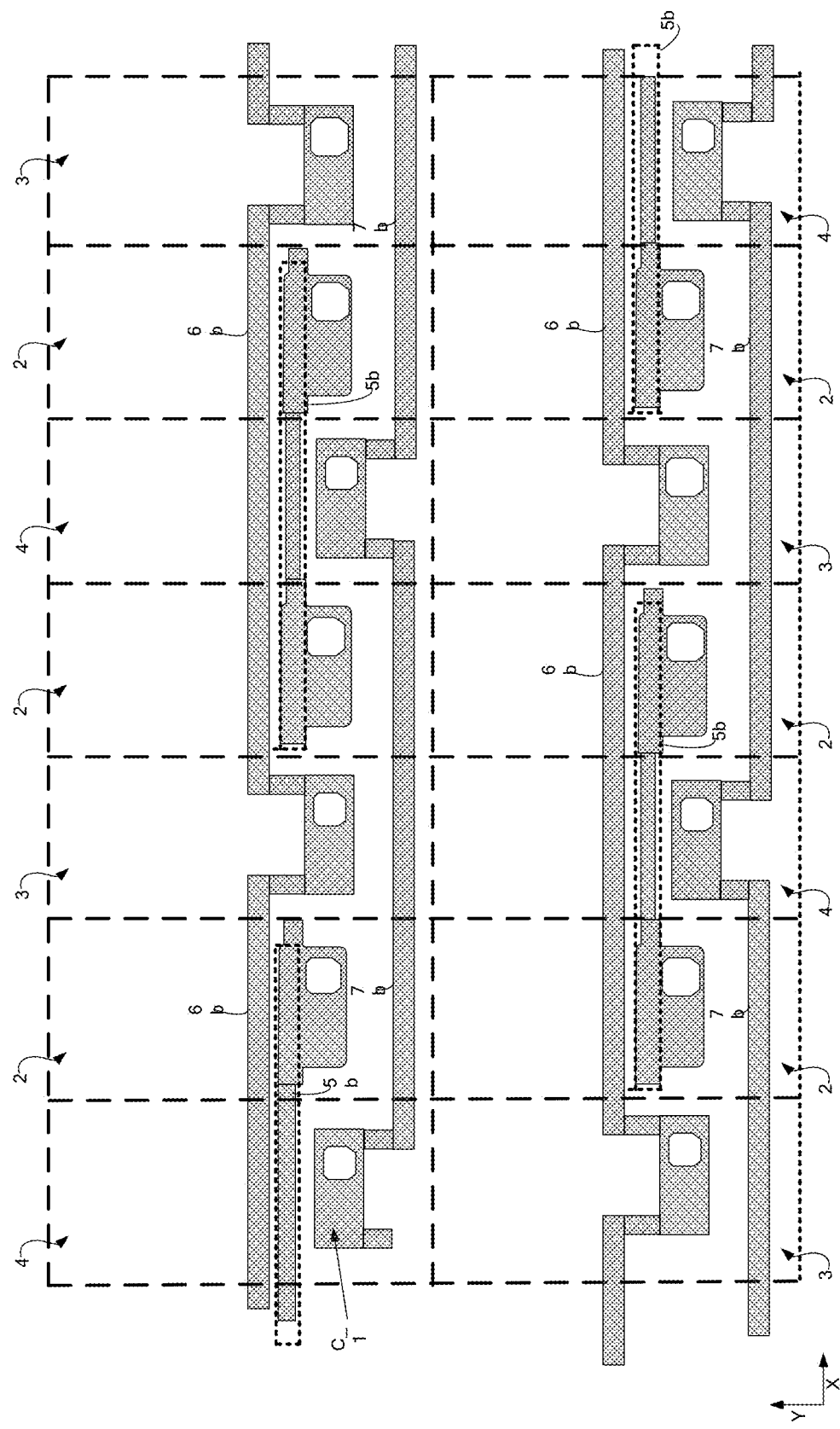
FIG. 16 is a layout of a layer structure in which the first end plate of the storage capacitor is located according to an embodiment of the present disclosure.

FIG. 16 is a layout of a layer structure in which the first end plate of the storage capacitor is located according to an embodiment of the present disclosure. As shown in FIG. 16, in some embodiments, in any row of the sub-pixels, first end plates C_1 of two storage capacitors C in any two adjacent second sub-pixels 3 are connected together through one of the second operating voltage connection lines 6b, first end plates C_1 of two storage capacitors C in any two adjacent third sub-pixels 4 are connected together through one of the third operating voltage connection lines 7b, first end plates C_1 of two storage capacitors C in two first sub-pixels 2 between two adjacent second sub-pixels 3 are connected together through one of the first operating voltage connection lines 5b, and the second operating voltage connection line 6b and the third operating voltage connection line 7b are located on opposite sides of the first operating voltage connection line 5b, respectively.

In other embodiments, in any row of the sub-pixels, first end plates C_1 of two storage capacitors C in any two adjacent second sub-pixels 3 are connected together through one of the second operating voltage connection lines 6b, first end plates C_1 of two storage capacitors C in any two adjacent third sub-pixels 4 are connected together through one of the third operating voltage connection lines 7b, first end plates C_1 of two storage capacitors C in two first sub-pixels 2 between two adjacent third sub-pixels 4 are connected together through one of the first operating voltage connection lines 5b, and the second operating voltage connection line 6b and the third operating voltage connection line 7b are located on opposite sides of the first operating voltage connection line 5b, respectively. It should be noted that a corresponding figure may not be given for this case.

An embodiment of the present disclosure further provides a display apparatus including the display substrate according to any one of the above embodiments. It should be noted that the display apparatus provided in this embodiment may be: a flexible wearable device, a mobile phone, a tablet computer, a television, a monitor, a laptop computer, a digital album, a navigator, or any other product or component having a display function. Other essential components of the display apparatus may be regarded as present by one of ordinary skill in the art, which is not described herein and should not be construed as limiting the present disclosure.

Further, the display apparatus may further include various types of display devices, such as a liquid crystal display device, an organic electroluminescence display device (e.g., an OLED display device, a QLED display device), a Mini LED display device, or the like, which is not limited herein.

It will be appreciated that the above implementations are merely exemplary implementations for the purpose of illustrating the principle of the present disclosure, and the present disclosure is not limited thereto. It will be apparent to one of ordinary skill in the art that various modifications and variations can be made to the disclosed embodiments without departing from the spirit and essence of the present disclosure. Such modifications and variations should also be considered as falling into the protection scope of the present disclosure.

What is claimed is:

1. A display substrate, comprising:
a base, comprising: a display region, and a peripheral region surrounding the display region;
a plurality of pixel units located in the display region and arranged in an array, each of which comprising at least two sub-pixels each comprising: a pixel driving circuit, and a light-emitting element, wherein the light-emitting element comprises: a first electrode, a light-emitting layer, and a second electrode arranged in sequence along a direction away from the base, wherein each sub-pixel is configured with a corresponding operating voltage transmission line, and the pixel driving circuit comprises: a driving transistor with a first pole electrically connected to the corresponding operating voltage transmission line, and a second pole electrically connected to the first electrode, the first electrode is located on a side of the driving transistor distal to the base, and the operating voltage transmission line is located between a layer structure where a control pole of the driving transistor is located and a layer structure where the first electrode is located; and
the at least two sub-pixels comprise: at least one first sub-pixel and at least one second sub-pixel, wherein the first sub-pixel is configured with a first operating voltage transmission line, and the second sub-pixel is configured with a second operating voltage transmission line, and the first operating voltage transmission line is insulated from the second operating voltage transmission line;
wherein the at least two sub-pixels further comprise: at least one third sub-pixel; and in a same pixel unit, the first sub-pixel and the third sub-pixel are configured with a same first operating voltage transmission line;
wherein the plurality of pixel units are arranged in an array taking a first direction as a row direction and a second direction as a column direction; each pixel unit comprises four sub-pixels, comprising two first sub-pixels, one second sub-pixel, and one third sub-pixel, and pixel driving circuits of the four sub-pixels in the pixel unit are arranged in a 2×2 matrix taking the first direction as a row direction and the second direction as a column direction; among the four pixel driving circuits arranged in the 2×2 matrix in a same pixel unit, the pixel driving circuits of the two first sub-pixels are arranged in one column, while the pixel driving circuit of the one second sub-pixel and the pixel driving circuit of the one third sub-pixel are arranged in the other column; and in the array formed by the plurality of pixel units, any two adjacent pixel units in the row direction form a repeated unit in which two second sub-pixels are located in different rows, and two third sub-pixels are located in different rows, respectively; and
wherein the first operating voltage transmission line is configured to transmit a first operating voltage to both the two first sub-pixels and the one third sub-pixel, the second operating voltage transmission line is configured to transmit a second operating voltage to the one second sub-pixel, and the first operating voltage is different from the second operating voltage.

2. The display substrate according to claim 1, wherein each sub-pixel is configured with a corresponding data line electrically connected to the pixel driving circuit, and a layer structure where the data line is located is between the layer structure where the control pole of the driving transistor is located and the layer structure where the first electrode is located;
the first operating voltage transmission line is disposed in the same layer as the data line; and
the second operating voltage transmission line is disposed in the same layer as the data line, or located between the layer structure where the data line is located and the layer structure where the first electrode is located.

3. The display substrate according to claim 1, wherein the at least two sub-pixels further comprise: at least one third sub-pixel; and
the third sub-pixel is configured with a third operating voltage transmission line that is insulated from the first operating voltage transmission line and the second operating voltage transmission line.

4. The display substrate according to claim 3, wherein each sub-pixel is configured with a corresponding data line electrically connected to the pixel driving circuit, and a layer structure where the data line is located is between the layer structure where the control pole of the driving transistor is located and the layer structure where the first electrode is located; and the third operating voltage transmission line is disposed in the same layer as the data line, or located between the layer structure where the data line is located and the layer structure where the first electrode is located.

5. The display substrate according to claim 1, wherein each pixel driving circuit further comprises: a storage capacitor; and the storage capacitor has a first end plate electrically connected to a corresponding operating voltage transmission line, and a second end plate electrically connected to the control pole of the driving transistor.

6. The display substrate according to claim 5, wherein the pixel driving circuit further comprises: a data write transistor, a threshold compensation transistor, a first reset transistor, a second reset transistor, a first light-emitting control transistor, and a second light-emitting control transistor, wherein the first pole of the driving transistor is electrically connected to the corresponding operating voltage transmission line through the first light-emitting control transistor, and the second pole of the driving transistor is electrically connected to the first electrode through the second light-emitting control transistor;

the data write transistor has a control pole electrically connected to a gate line in a corresponding row, a first pole electrically connected to a data line in a corresponding column, and a second pole electrically connected to the first pole of the driving transistor;

the threshold compensation transistor has a control pole electrically connected to the gate line in the corresponding row, a first pole electrically connected to the second pole of the driving transistor; and a second pole electrically connected to the control pole of the driving transistor;

the first reset transistor has a control pole electrically connected to a reset control signal line in the corresponding row, a first pole electrically connected to a reset voltage transmission line, and a second pole electrically connected to the control pole of the driving transistor;

the second reset transistor has a control pole electrically connected to the reset control signal line in the corresponding row, a first pole electrically connected to the reset voltage transmission line, and a second pole electrically connected to the first electrode;

the first light-emitting control transistor has a control pole electrically connected to a light-emitting control signal line, a first pole electrically connected to the operating voltage transmission line, and a second pole electrically connected to the first pole of the driving transistor; and the second light-emitting control transistor has a control pole electrically connected to the light-emitting control signal line, a first pole connected to the second pole of the driving transistor; and a second pole electrically connected to the first electrode.

7. The display substrate according to claim 6, further comprising: an active semiconductor layer, a gate insulation layer structure, a first conductive layer structure, a first insulation layer structure, a second conductive layer structure, a second insulation layer structure, and a third conductive layer structure sequentially arranged along the direction away from the base; wherein the active semiconductor layer comprises: an active layer pattern and a source-drain doped region pattern of each transistor in the pixel driving circuit;

the first conductive layer structure comprises: the control pole of each transistor, the reset control signal line, the gate line, the second end plate of the storage capacitor, and the light-emitting control signal line in the pixel driving circuit;

the second conductive layer structure comprises: the reset voltage transmission line and the first end plate of the storage capacitor; and the third conductive layer structure comprises: the data line and the first operating voltage transmission line.

8. The display substrate according to claim 7, wherein the control pole of the data write transistor, the control pole of the threshold compensation transistor, the control pole of the first reset transistor, and the control pole of the second reset transistor are each located on a first side of the control pole of the driving transistor, the control pole of the first light-emitting control transistor and the control pole of the second light-emitting control transistor are each located on a second side of the control pole of the driving transistor, and the first side and the second side are opposite sides in the second direction;

the control pole of the data write transistor and the control pole of the first light-emitting control transistor are each located on a third side of the control pole of the driving transistor, a first control pole of the threshold compensation transistor, the control pole of the second light-emitting control transistor, and the control pole of the second reset transistor are each located on a fourth side of the control pole of the driving transistor, and the third side and the fourth side are opposite sides in the first direction;

the data line and the first operating voltage transmission line both extend in the second direction; and for any one of the first sub-pixels, the data line configured for the first sub-pixel is located on a third side of the first operating voltage transmission line configured for the first sub-pixel.

9. The display substrate according to claim 8, wherein the second operating voltage transmission line extends in the second direction; and for any one of the second sub-pixels, an orthogonal projection of the data line configured for the second sub-pixel on the base is located on a third side of the second operating voltage transmission line configured for the second sub-pixel.

10. The display substrate according to claim 9, wherein in a same pixel unit, the first sub-pixel and the third sub-pixel are configured with a same first operating voltage transmission line;

the first operating voltage transmission line has an orthogonal projection on the base overlapped with an orthogonal projection on the base of the source-drain doped region pattern corresponding to the first pole of the first light-emitting control transistor in the pixel driving circuit of a corresponding first sub-pixel, and is connected to the source-drain doped region pattern corresponding to the first pole of the first light-emitting control transistor in the pixel driving circuit of the corresponding first sub-pixel through a via;

the first end plate of the storage capacitor in the pixel driving circuit of the third sub-pixel comprises a first extension part and a second extension part;

the first extension part is directly connected to the first end plate of the storage capacitor in the pixel driving circuit of an adjacent first sub-pixel in the first direction and located in the same pixel unit; and the second extension part has an orthogonal projection on the base overlapped with an orthogonal projection on the base of the source-drain doped region pattern corresponding to the first pole of the first light-emitting control transistor in the same pixel driving circuit, and is connected to the source-drain doped region pattern corresponding to the first pole of the first light-emitting control transistor in the same pixel driving circuit through a via.

11. The display substrate according to claim 9, wherein in a same pixel unit, the first sub-pixel and the third sub-pixel are configured with a same first operating voltage transmission line;

the first operating voltage transmission line has an orthogonal projection on the base overlapped with an orthogonal projection on the base of the source-drain doped region pattern corresponding to the first pole of the first light-emitting control transistor in the pixel driving circuit of a corresponding first sub-pixel, and is connected to the source-drain doped region pattern corresponding to the first pole of the first light-emitting control transistor in the pixel driving circuit of the corresponding first sub-pixel through a via;

the first end plate of the storage capacitor in the pixel driving circuit of the third sub-pixel comprises a first extension part which is directly connected to the first end plate of the storage capacitor in the pixel driving circuit of an adjacent first sub-pixel in the first direction and located in the same pixel unit;

the second operating voltage transmission line has an orthogonal projection on the base overlapped with an orthogonal projection on the base of the source-drain doped region pattern corresponding to the first pole of the first light-emitting control transistor in the pixel driving circuit of a corresponding second sub-pixel, and is connected to the source-drain doped region pattern corresponding to the first pole of the first light-emitting control transistor in the pixel driving circuit of the corresponding second sub-pixel through a via; and the source-drain doped region pattern corresponding to the first pole of the first light-emitting control transistor in the pixel driving circuit of the third sub-pixel is electrically connected to the first operating voltage transmission line configured for the first sub-pixel in the same pixel unit through a conductive bridge line, and the conductive bridge line is connected to the source-drain doped region pattern corresponding to the first pole of the first light-emitting control transistor in the pixel driving circuit of the third sub-pixel through a via.

12. The display substrate according to claim 11, wherein the second operating voltage transmission line is bent around the via through which the conductive bridge line is connected to the source-drain doped region pattern corresponding to the first pole of the corresponding first light-emitting control transistor, and towards a side distal to the conductive bridge line to form a protruding bypass structure; or wherein in a same pixel driving circuit, the source-drain doped region pattern corresponding to the first pole of the first light-emitting control transistor is disposed opposite to the source-drain doped region pattern corresponding to the second pole of the second light-emitting control transistor in the first direction; in the pixel driving circuit of the third sub-pixel, the source-drain doped region pattern corresponding to the first pole of the first light-emitting control transistor has a first length in the first direction; in the pixel driving circuit of the first sub-pixel or the second sub-pixel, the source-drain doped region pattern corresponding to the first pole of the first light-emitting control transistor has a second length in the first direction, and the second length is smaller than the first length; in the pixel driving circuit of the third sub-pixel, the source-drain doped region pattern corresponding to the first pole of the first light-emitting control transistor is spaced apart from the source-drain doped region pattern corresponding to the second pole of the second light-emitting control transistor by a first interval in the first direction; and in the pixel driving circuit of the second sub-pixel, the source-drain doped region pattern corresponding to the first pole of the first light-emitting control transistor is spaced apart from the source-drain doped region pattern corresponding to the second pole of the second light-emitting control transistor by a second interval in the first direction, and the first interval is smaller than the second interval.

13. The display substrate according to claim 11, wherein a third insulation layer structure, a fourth conductive layer structure, and a fourth insulation layer structure are sequentially arranged between the third conductive layer structure and the layer structure where the first electrode is located in the direction away from the base;

the third conductive layer structure comprises a third connection part, the fourth conductive layer structure comprises a fourth connection part, and the second pole of the second light-emitting control transistor is electrically connected to the first electrode through the third connection part and the fourth connection part sequentially; and the fourth conductive layer structure comprises the conductive bridge line.

14. The display substrate according to claim 9, wherein the third sub-pixel is configured with a third operating voltage transmission line that is insulated from the first operating voltage transmission line and the second operating voltage transmission line;

the first operating voltage transmission line has an orthogonal projection on the base overlapped with an orthogonal projection on the base of the source-drain doped region pattern corresponding to the first pole of the first light-emitting control transistor in the pixel driving circuit of a corresponding first sub-pixel, and is connected to the source-drain doped region pattern corresponding to the first pole of the first light-emitting control transistor in the pixel driving circuit of the corresponding first sub-pixel through a via;

the second operating voltage transmission line has an orthogonal projection on the base overlapped with an orthogonal projection on the base of the source-drain doped region pattern corresponding to the first pole of the first light-emitting control transistor in the pixel driving circuit of a corresponding second sub-pixel, and is connected to the source-drain doped region pattern corresponding to the first pole of the first light-emitting control transistor in the pixel driving circuit of the corresponding second sub-pixel through a via;

the third operating voltage transmission line has an orthogonal projection on the base overlapped with an orthogonal projection on the base of the source-drain doped region pattern corresponding to the first pole of the first light-emitting control transistor in the pixel driving circuit of a corresponding third sub-pixel, and is connected to the source-drain doped region pattern corresponding to the first pole of the first light-emitting control transistor in the pixel driving circuit of the corresponding third sub-pixel through a via;

the third operating voltage transmission line extends in the second direction; and in a same pixel unit, the third sub-pixel and the second sub-pixel are configured with a same data line which has on the base an orthogonal projection located on a third side of the orthogonal projection of the third operating voltage transmission line configured for the third sub-pixel on the base, and the orthogonal projection of the third operating voltage transmission line configured for the third sub-pixel on the base is located on a third side of the orthogonal projection of the second operating voltage transmission line configured for the second sub-pixel on the base.

15. The display substrate according to claim 5, further comprising: a plurality of first operating voltage connection lines extending in a direction crossed with an extending direction of the first operating voltage transmission line, and each first operating voltage connection line is electrically connected to at least two first operating voltage transmission lines; and each first operating voltage connection line is disposed in the same layer as the first end plate of the storage capacitor;

or the display substrate further comprises: a plurality of second operating voltage connection lines extending in a direction crossed with an extending direction of the second operating voltage transmission line, and each second operating voltage connection line is electrically connected to at least two second operating voltage transmission lines; and each second operating voltage connection line is disposed in the same layer as the first end plate of the storage capacitor, or disposed in the same layer as the first electrode, or located between the layer structure where the first end plate of the storage capacitor is located and the layer structure where the first electrode is located; wherein the pixel driving circuit further comprises: a first reset transistor and/or a second reset transistor; the first reset transistor has a control pole electrically connected to a reset control signal line in a corresponding row, a first pole electrically connected to a reset voltage transmission line, and a second pole electrically connected to the control pole of the driving transistor; the second reset transistor has a control pole electrically connected to the reset control signal line in the corresponding row, a first pole electrically connected to the reset voltage transmission line, and a second pole electrically connected to the first electrode; the reset control signal line is disposed in the same layer as the second end plate of the storage capacitor and extends in the first direction, the reset voltage transmission line is disposed in the same layer as the first end plate of the storage capacitor and extends in the first direction, and an orthogonal projection of the reset control signal line on the base is not overlapped with an orthogonal projection of the reset voltage transmission line on the base; and the second operating voltage transmission line is located between the layer structure where the first end plate of the storage capacitor is located and the layer structure where the first electrode is located, and extends in the first direction; and the second operating voltage transmission line has on the base an orthogonal projection located in a coverage region of an orthogonal projection of the reset voltage transmission line on the base, or located in a coverage region of an orthogonal projection of the reset control signal line on the base;

or wherein the third sub-pixel is configured with a third operating voltage transmission line; the display substrate further comprises: a plurality of third operating voltage connection lines extending in a direction crossed with an extending direction of the third operating voltage transmission line, and each third operating voltage connection line is electrically connected to at least two third operating voltage transmission lines; and each third operating voltage connection line is disposed in the same layer as the first end plate of the storage capacitor, or disposed in the same layer as the first electrode, or located between the layer structure where the first end plate of the storage capacitor is located and the layer structure where the first electrode is located;

or wherein in a same pixel unit, the first sub-pixel and the third sub-pixel are configured with a same first operating voltage transmission line; the display substrate further comprises: a plurality of first operating voltage connection lines and a plurality of second operating voltage connection lines; the plurality of first operating voltage connection lines and the plurality of second operating voltage connection lines both extend in the first direction, the first operating voltage transmission line and the second operating voltage transmission line both extend in the second direction, each first operating voltage connection line is electrically connected to at least two first operating voltage transmission lines, each second operating voltage connection line is electrically connected to at least two second operating voltage transmission lines; and each first operating voltage connection line and each second operating voltage connection line are disposed in the same layer as the first end plate of the storage capacitor; wherein in any row of the sub-pixels, first end plates of two storage capacitors in any two adjacent second sub-pixels are connected together through one of the second operating voltage connection lines, and first end plates of three storage capacitors in two first sub-pixels and one third sub-pixel between two adjacent second sub-pixels are connected together through one of the first operating voltage connection lines;

or wherein the third sub-pixel is configured with a third operating voltage transmission line; the display substrate further comprises: a plurality of first operating voltage connection lines, a plurality of second operating voltage connection lines, and a plurality of third operating voltage connection lines; the plurality of first operating voltage connection lines, the plurality of second operating voltage connection lines and the plurality of third operating voltage connection lines all extend in the first direction, the first operating voltage transmission line, the second operating voltage transmission line and the third operating voltage transmission line each extend in the second direction, each first operating voltage connection line is electrically connected to at least two first operating voltage transmission lines, each second operating voltage connection line is electrically connected to at least two second operating voltage transmission lines, and each third operating voltage connection line is electrically connected to at least two third operating voltage transmission lines; and each first operating voltage connection line, each second operating voltage connection line and each third operating voltage connection line are disposed in the same layer as the first end plate of the storage capacitor; wherein in any row of the sub-pixels, first end plates of two storage capacitors in any two adjacent second sub-pixels are connected together through one of the second operating voltage connection lines, first end plates of two storage capacitors in any two adjacent third sub-pixels are connected together through one of the third operating voltage connection lines, first end plates of two storage capacitors in two first sub-pixels between two adjacent second sub-pixels are connected together through one of the first operating voltage connection lines, and the second operating voltage connection line and the third operating voltage connection line are located on opposite sides of the first operating voltage connection line; or in any row of the sub-pixels, first end plates of two storage capacitors in any two adjacent second sub-pixels are connected together through one of the second operating voltage connection lines, first end plates of two storage capacitors in any two adjacent third sub-pixels are connected together through one of the third operating voltage connection lines, first end plates of two storage capacitors in two first sub-pixels between two adjacent third sub-pixels are connected together through one of the first operating voltage connection lines, and the second operating voltage connection line and the third operating voltage connection line are located on opposite sides of the first operating voltage connection line.

16. The display substrate according to claim 1, wherein the first sub-pixel comprises a green light-emitting element, the second sub-pixel comprises a blue light-emitting element, and the third sub-pixel comprises a red light-emitting element.

17. The display substrate according to claim 1, further comprising: a first operating voltage peripheral lead and a second operating voltage peripheral lead both in the peripheral region; wherein the first operating voltage transmission line extends into the peripheral region and is electrically connected to the first operating voltage peripheral lead, and the second operating voltage transmission line extends into the peripheral region and is electrically connected to the second operating voltage peripheral lead; and/or wherein a material of the light-emitting layer comprises a quantum dot material.

18. A display apparatus, comprising the display substrate according to claim 1.

\* \* \* \* \*